(12) United States Patent
Shimizu et al.

(10) Patent No.: US 6,191,975 B1
(45) Date of Patent: Feb. 20, 2001

(54) NON-VOLATILE NAND TYPE SEMICONDUCTOR MEMORY DEVICE WITH STACKED GATE MEMORY CELLS AND A STACKED GATE SELECT TRANSISTOR

(75) Inventors: Kazuhiro Shimizu; Shinji Satoh; Seiichi Aritome, all of Yokohama (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/468,333

(22) Filed: Dec. 21, 1999

(30) Foreign Application Priority Data

Dec. 22, 1998 (JP) .................................................. 10-364611

(51) Int. Cl.$^7$ .................................................. G11C 16/04
(52) U.S. Cl. ................................ 365/185.17; 365/185.01; 257/316
(58) Field of Search ........................ 365/185.17, 185.01; 257/316, 326, 315

(56) References Cited

U.S. PATENT DOCUMENTS 5,179,427 * 1/1993 Nakayama et al. .................. 257/211
5,589,699   12/1996 Araki .................................... 257/316
5,949,101    9/1999 Aritome .............................. 257/315

* cited by examiner

Primary Examiner—Vu A. Le
(74) Attorney, Agent, or Firm—Banner & Witcoff, Ltd.

(57) ABSTRACT

In the field of EEPROM, memory cell structures and operation methods have been required which are suitable for ultrahigh-integration and high-reliability EEPROMS with no danger of erroneous writing. To meet this requirement, in this invention, the gate of each of select gate cells located on the source line side and the bit line side of a NAND type memory cell array is formed of two layers of a charge storage layer and a control gate layer as with memory cells. The select gate cells are formed at the same time in the same process as memory cells. The ion implantation conditions for the cell channels are set so as to optimize the memory cell channel boost ratio. The optimization of the cutoff characteristic required of the select gate cells is performed by injection of charges into the charge storage layers of the select gate cells without owing to ion implantation. The memory and select gate cells are formed into the same shape. The charge storage layer is formed to self-align to an isolation trench.

12 Claims, 15 Drawing Sheets

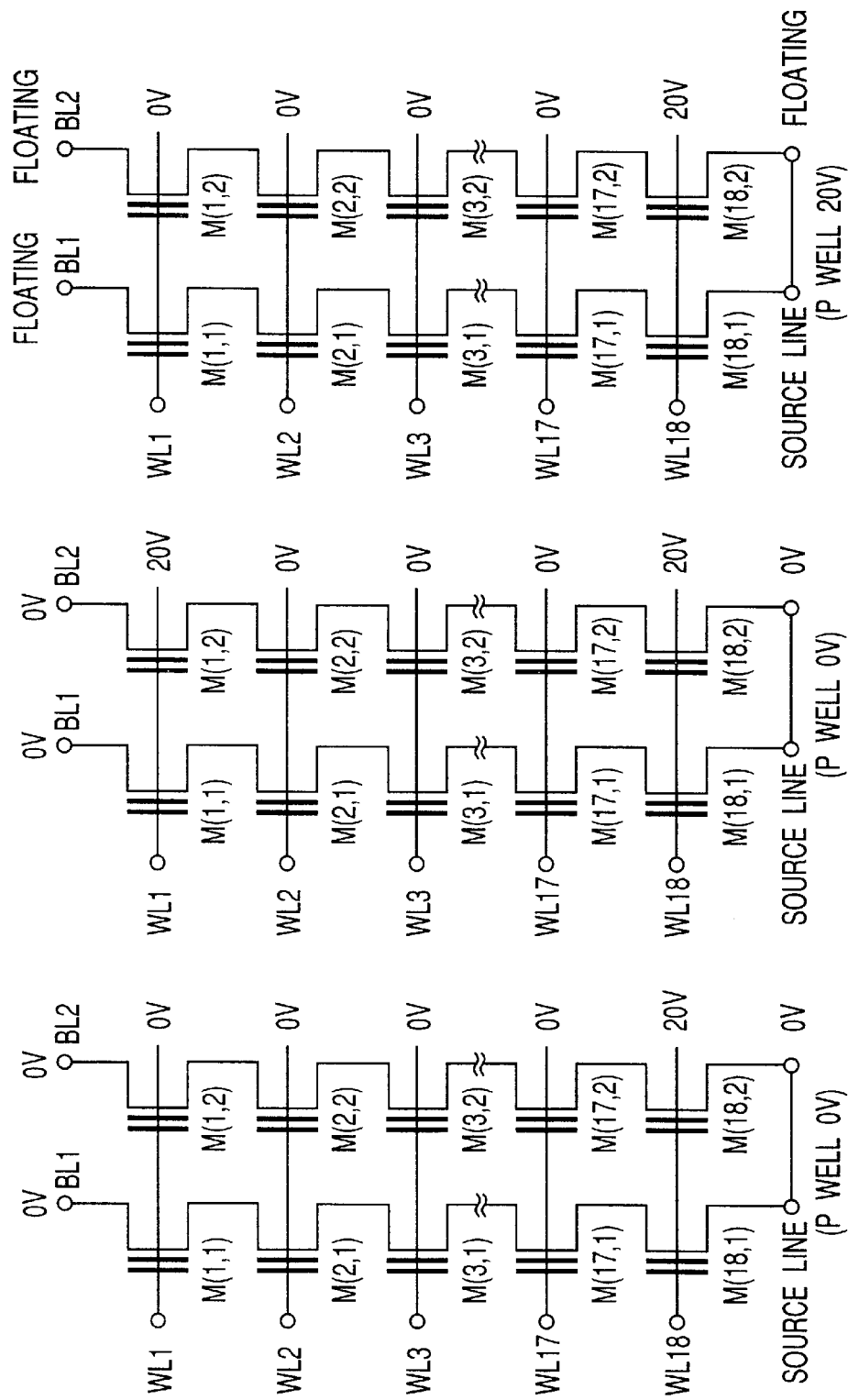

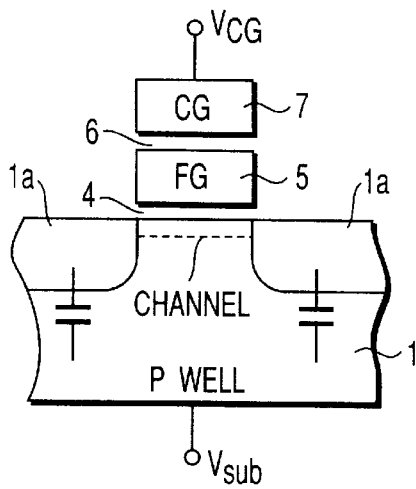
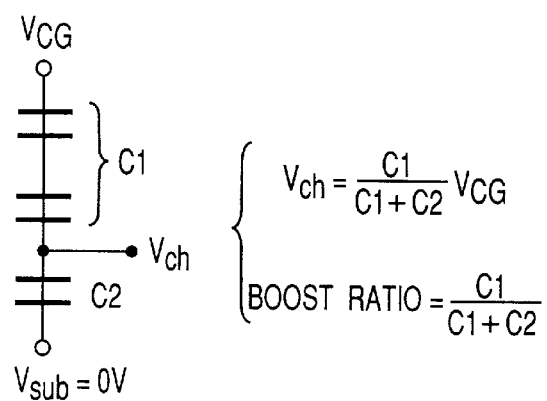
FIG. 20A  FIG. 20B  FIG. 20C
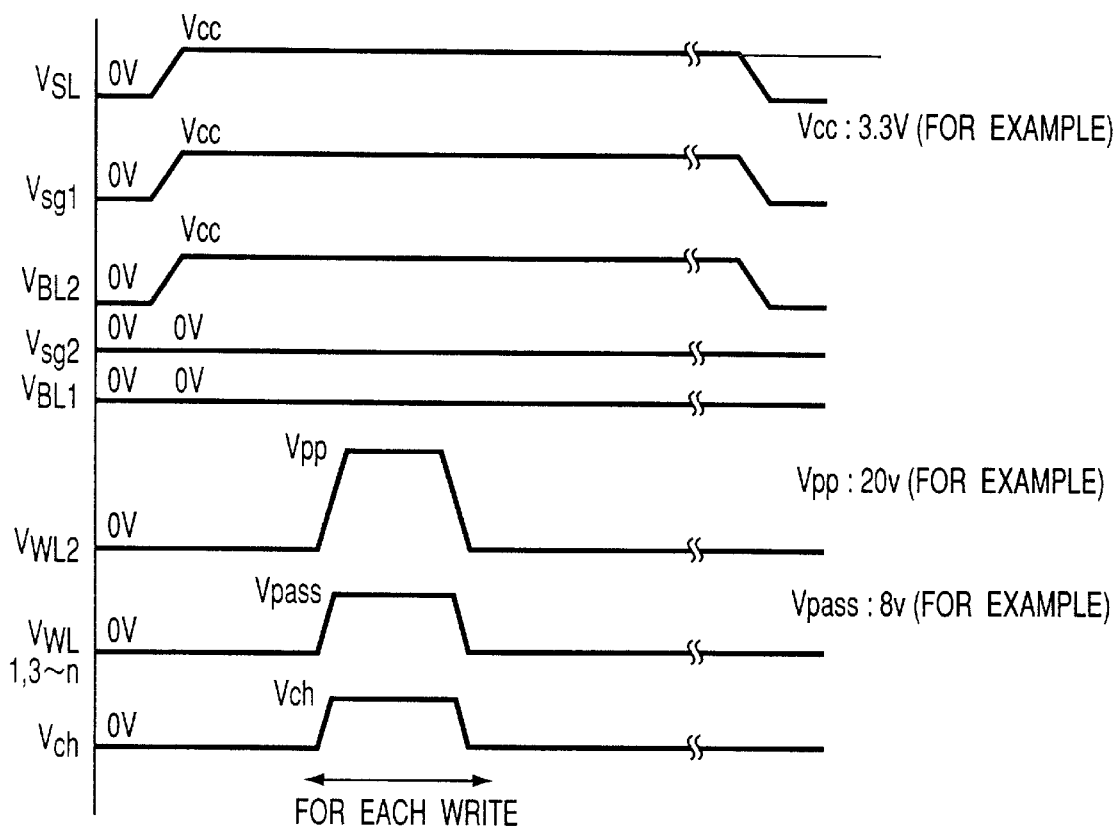
FIG. 21

NON-VOLATILE NAND TYPE SEMICONDUCTOR MEMORY DEVICE WITH STACKED GATE MEMORY CELLS AND A STACKED GATE SELECT TRANSISTOR

BACKGROUND OF THE INVENTION

The present invention relates to a non-volatile semiconductor memory device and more particularly to techniques for allowing for high integration and high performance of a non-volatile semiconductor memory device using electrically alterable memory cells each having a two-layered gate structure of a charge storage layer and a control gate layer.

Conventionally there is known a form of electrically erasable programmable read only memory (EEPROM) in which MOS transistor-structured memory cells each having a multilayered structure of a charge storage layer and a control gate layer are arranged in a matrix.

FIG. 11 is a fragmentary plan view of an EEPROM of a NAND cell array in which each NAND cell comprises a plurality of memory cells connected in series. A plurality of signal lines BLj (shown for j=1 to 3; hereinafter referred to as bit lines) and a common line (hereinafter referred to as a source line) are connected to memory cells M(i, j) (shown for i=1 to 16 and j=1 to 3) through bit line contacts and source line contacts, respectively. The source line is connected to a reference voltage (e.g., ground potential).

In each column, memory cells M(1, j) to M(16, j) are series-connected so that adjacent memory cells share a diffused layer serving as a source/drain, thus forming a NAND cell.

The memory cells each have a multilayered gate structure of a charge storage layer (hatched by broken lines in FIG. 11) and a control gate layer for controlling an amount of charge stored in the charge storage layer. The charge storage layer is isolated from adjacent ones between each bit line. The control gate layers of the memory cells in each row are contiguous to be formed into one of word lines WLi (i=1 to 16) that intersect the bit lines BLj (j=1 to 3). Each word line WLi is connected to one memory cell M(i, j) for each bit line BLj.

To selectively write into and read from the memory cells, each NAND cell further comprises two select gate cells S(k, j) (k=1, 2, j=1 to 3) connected to both ends of the series-connected memory cells M(i, j).

That is, the two select gate cells S(k, j) are placed adjacent to the bit line contact and the source line contact. The memory cells M(i, j) and the two select gate cells S(k, j) are formed in each device region that extends in the direction of length of the bit lines Bj so that adjacent ones share a source/drain diffused region. The device regions are isolated by device isolation regions.

The switching control of the select gate cells S(k, j) is performed by two select gate lines SGk (k=1, 2). One of the select gate lines is provided on the bit line side and the other of the select gate lines is provided on the source line side. As an alternative, two or more select gate cells may be placed on each side.

FIG. 12 is a sectional view taken along line XII—XII of FIG. 11.

The memory cell M(i,1) and the select gate cell Sk1 are each formed from a silicon substrate (p-well region) 1, n-type diffused layers 1a serving as source/drain regions, a first gate insulating layer 4 made of a thin silicon oxide film formed on the substrate, a charge storage layer 5 made of polysilicon, a second gate insulating film 6 formed on the charge storage layer 5 at a thickness larger than the first gate insulating layer, and a control gate layer 7 made of polysilicon.

The charge storage layer 5 in the memory cell M(i, j) is left floating and the tunnel injection of electrons from the n-type channel of the memory cell into the charge storage layer allows the memory cell to be written into. At this point, a write control voltage is applied to the control gate layer 7. The operation of the EEPROM will be described in detail later.

The EEPROM of FIG. 12 further comprises an interlayer insulating film 8, a bit line (BL1) 9, a bit line contact 10, a source line 11, and a source line contact 12. A sectional view taken along line XIII—XIII of FIG. 11 is shown in FIG. 13.

In FIG. 13, like reference numerals are used to denote corresponding parts to those in FIG. 12. WL1 is a word line 13 that is made of a continuous control gate layer 7. The memory cells M(1, j) (j=1 to 3) are isolated by isoplanar-type device isolation regions 3a.

In the cross sectional structure of FIG. 12, the select gate cell Sk1, like the memory cell M(i, j), has a multilayered gate structure of charge storage layer 5 and control gate layer 7. It has been thought heretofore that there is no need of providing a charge storage layer 5 in particular in the select gate cell Sk1 because the select gate cell is no more than a switching transistor used to selectively write data into or read data from the memory cells.

If the select gate cell is formed to have the same gate structure as the memory cell as shown in FIG. 12, then the mask alignment process will become simple in comparison with the case where each of them has a separate structure, which is favorable for high-density integration. For this reason, in many cases the select gate cell is also formed with the charge storage layer as in the case of the memory cell and contact is then made to the charge storage layer.

As an example, a conventional method to make contact to the charge storage layer of the select gate cell on the bit line side is illustrated in FIG. 14. The charge storage layer (FG) indicated by right-downward broken lines (and partially by right-downward continuous lines) and the control gate layer (CG) indicated by left-downward continuous lines indicate the planar shape of the charge storage layer 5 and the control gate 7.

SG1 indicates the select gate on the bit line side and WL1 indicates a word line adjacent to SG1. Vertical dash-dotted lines indicate the boundaries of the device isolation region. Vertical dashed lines on the WL1 indicate the edges of the respective FGs in the device isolation region. The FG portions formed below the CG are indicated by broken lines.

As shown in FIG. 14, in the select gate SG1 a FG is made of a continuous layer over the whole area thereof. A portion of the CG is removed in the device isolation region and the FG in the contact area is broadened in the form of a pad to make contact to the FG. Thus, alignment margin for the contact portion is needed, which prevents high-density integration of EEPROM. On the other hand, as shown by the vertical broken lines on the word lines in FIG. 11, the memory cell charge storage layers 5 associated with adjacent bit lines are isolated from each other in the device isolation region. In the plan view of FIG. 11, vertical broken lines indicating the boundaries of the charge storage layers 5 are not shown in the select gate cells S(k, j) connected to the select gates SG1 and SG2; for, in practice, the continuous charge storage layer is formed as shown in FIG. 14.

In FIG. 11, the contact portion for the charge storage layer and the control gate layer shown in FIG. 14 is omitted. In FIG. 14, the boundaries of the charge storage layers are shown by vertical broken lines on WL1 because they are isolated from each other in the device isolation region.

FIG. 15 is a plan view of a mask pattern used in a lithography process for separating the charge storage layer between each bit line after the deposition of polysilicon as the charge storage layers of the respective memory cells M(i, j). In FIG. 15, M(1, j) (j=1 to 3) and S1j (j=1 to 3) indicate areas where memory cells and select gate cells are to be formed, respectively. WL1 and SG1 are a word line and a select gate, respectively.

It is required to remove a portion of the charge storage layer of the memory cells M(1, j) connected to the word line WL1 between each bit line, but the charge storage layer of the select gate cells S1j connected to the select gate SG1 is left continuous as shown in FIG. 15.

Thus, the mask pattern shown in FIG. 15 will have to be provided, as shown by arrows in FIG. 15, with boundaries between the areas where the charge storage layer is cut into sections and the areas where the charge storage area is not cut. However, such boundaries will make it necessary to make allowance for additional alignment margin in the lithography process in comparison with the case where no boundaries are included. In such a case, it will become very difficult to minimize the spacing between the word line WL1 connected to the memory cells and the select gate SG1 connected to the select gate cells.

Next, explanation is made of the problems with the case where, as shown in FIG. 16, the select gate cells are formed into a single-layer structure of the control gate layer 7 alone so that contact to the charge storage layer can be removed for ease of high-density integration.

FIG. 16 is a sectional view corresponding to FIG. 12. Whereas the memory cells M(i,1) have the multilayered gate structure of the charge storage layer 5 and the control gate layer 7, the select gate cells Sk1 have a single-layer gate structure of the control gate layer 7. To form the single-layer gate structure, either of the two gate layers has to be processed or removed.

As described previously in conjunction with FIG. 15, to remove one of the gate layers of the select gate cells, additional mask alignment is needed in the lithography process and alignment margin has to be allowed for. For this reason, the spacing between the select gate SGk and the word line WLi cannot be made small enough in comparison with the spacing between each word line. This is a serious problem in fine pattern formation of the memory cell array.

Using FIG. 17, explanation is made of problems in the case where the memory cells and the select gate cells each have the multi-layered gate structure and, as with the memory cells, the charge storage layer of the select gate cells is also cut into sections between each bit line. FIG. 17 is a sectional view corresponding to FIG. 11.

Since the charge storage layer 5 of the select gate cells is cut between each bit line, to connect the charge storage layer 5 and the control gate layer 7 the removal of the second gate insulating film 6 between the charge storage layer and the control gate layer is more suitable for improving integration density than the provision of many such contacts as shown in FIG. 14.

However, since the second gate insulating film 6 must be left in the memory cells, the removal of the second gate insulating film only for the select gate cells will need such a mask pattern as shown in FIG. 18.

In FIG. 18, horizontal broken lines indicate the word line WL1 to which the memory cells M(1, j) are connected and the select gate lines SG1 to which the select gate cells S1j are connected. The vertical broken lines on the word line WL1 and the select gate line SG1 indicate the edges of the charge storage layers 5 of the memory cells and the select gate cells.

By removing the second gate insulating film 6 in the regions where the select gate cells are formed using the mask pattern shown in FIG. 18, the charge storage layers of the select gate cells S1j are all connected to the select gate SG1.

However, the mask pattern shown in FIG. 18 will have to be provided, as shown by arrows, with boundaries between the areas where the second gate insulating film is removed and the areas where the gate insulating film is not removed, making it necessary to make allowance for additional alignment margin. In such a case, it will become very difficult to minimize the spacing between the word line WL1 and the select gate SG1.

Increasing the spacing between the select gate SGk and the word line WLi in comparison with the spacing between each word line leads to an increase in the occupied area of the memory cell array and a significant decline in dimensional controllability. This will be explained below.

As is well known, in a fine pattern formation process with a minimum dimension of 0.25 $\mu$m or below, when the spacing between pattern elements is widened, the proximity effect becomes marked, resulting in dimensional shrinkage in lithography or dimensional expansion in RIE (reactive ion etching). Thus, the dimensional controllability declines considerably. In the presence of differently spaced pattern elements in the memory cell array, therefore, it becomes very difficult to control the dimensions precisely.

The EEPROM has been expected to find use as a constituent element in a mass storage recording device and it is therefore required that the cell area be minimized and the cost per bit of storage be reduced. To this end, scaling rules are applied to minimize the width (gate length) of and the spacing between gates in the direction of bit line length.

Under such circumstances, the provision of new contact to the charge storage layer 5 of the select gate cells or the addition of a new mask alignment process for producing differently structured memory and select gate cells prevents the fine pattern formation of EEPROM and limits the range of applicability thereof.

The problems in the operation of NAND type EEPROM will be described next. Conventionally, a self-boost writing technique which allows writing into EEPROM at a low voltage has been developed and put into practical use.

The technique allows transistors in a column decoder connected to bit lines and the like to be operated from a Vcc power supply (3.3V), thus resulting in a reduction in the area of peripheral circuitry and consequently in the chip area.

The conventional self-boost write operation will be described with reference to FIG. 19, which illustrates an equivalent circuit of NAND type EEPROM with an operating voltage supplied to each terminal in a self-boost write operation. This equivalent circuit comprises bit lines BL1 and BL2, select gates SG1 and SG2, word lines WL1 to WLn formed of control gate layers of memory cells, and a source line.

Here, an operation of writing two-valued data ("1" or "0") into one memory cell will be described. In the case of multi-valued data, it is simply required that "1" data be changed for "0" data (the threshold voltage is negative) and "0" data be changed for "1", "2", and "3" data (the threshold voltage is positive and each data is defined by a certain threshold voltage range). Even with multi-valued memories with no such threshold voltage distribution, a like operation can be performed as long as different threshold voltages are set.

In FIG. 19, when the word line WL2 is selected to write a 0 into the memory cell A (M(2,1)) in a solid circle placed at the intersection of the bit line BL1 and the word line WL2, erroneous writing may occur in non-selected cells B (M(2, 2)) and C (M(3,1)) circled by broken lines.

Note that, in FIG. 19, the non-selected cells B and C are merely shown as an example. The same problem as with the cell B also arises in memory cells connected to the selected word line WL2 and "1" write bit lines other than BL2. The same problem as with the cell C also arises in memory cells connected to the bit line BL1 and non-selected word lines WL1 and WL3 to WLn. In the "1" write state, memory cells are placed in the erase state in which "0" is not written.

Normally, NAND-connected memory cells are sequentially written into starting with the memory cell farthest from the bit line. For random writing, the memory cells are written into at random. In the self-boost write operation, the voltage Vsg2 to the select gate SG2 on the source line side is kept at 0V to place the select gate cells S21 and S22 in the off state.

Next, the voltage VBL1 at the bit line BL1 (selected bit line) connected to the cell A (M(2,1)) into which a 0 is to be written is kept at 0V. To the bit line BL2 (non-selected bit line) connected to the cell B (M(2,2)) into which a 1 is to be written is applied a voltage VBL2 which is equal to voltage Vsg1 to the select gate SG1 on the drain side or a voltage VBL2 which is high or low enough turn the select gate cell S12 off. As a result, the select gate cell S11 is placed in the on state and the select gate cell S12 is placed in the off state. Thus, the bit lines BL1 and BL2 allow memory cells to be selectively written into.

In this state, a transfer voltage Vpass (or a write voltage Vpp) is applied to all the word lines in a selected block comprising a plurality of NAND cells, allowing the memory cells to enter the on state. At a certain value on the rising edge of a voltage pulse, all the memory cells in the selected block are placed in the on state, so that 0V is transferred to the channel of each of the NAND-connected cells connected to the "0" write bit line BL1.

The channel of each of the NAND cells connected to the "1" write bit line BL2 becomes floating with an initial voltage, which is the voltage VBL2 at that bit line minus the threshold voltage of the select gate cell S12, transferred from the bit line BL2 via the select gate S12. At this point, the source line is supplied with 0V or a positive voltage that allows the select gate cells S21 and S22 on the source side to turn off.

Next, when a write voltage pulse Vpp is applied to the selected word line WL2, the cell A connected to that word line and the bit line BL1 supplied with 0V is written with a 0. At this point, the channel of the cell B connected to the selected word line WL2 and the "1" write bit line BL2 is left floating because the select gate cell S12 is cut off.

The channel voltage of the cell B is required to be high enough not to allow a 0 to be written into it. That is, it is required to set the voltage Vch applied to the channel of the cell B so that a variation in the threshold voltage of the cell B due to the write voltage pulse Vpp is within an allowable range. For the cell B, the smaller the difference between the write voltage Vpp and the channel voltage Vch, the smaller the variation in the threshold voltage.

To this end, a certain transfer voltage Vpass is applied to the non-selected word lines WL1 and WL3 to WLn as word line voltages VWL1 and VWL3 to VWLn so as to raise the channel voltage Vch of the cell B to a certain voltage through capacitive coupling. The higher the transfer voltage Vpass, the higher the channel voltage Vch of the cell B. Thus, as Vpass increases in magnitude, the variation in the threshold voltage of the cell B becomes small.

On the other hand, the transfer voltage Vpass is also applied to the non-selected cell C of the memory cells connected to the bit line BL1 supplied with 0V. Unlike the cell B, therefore, the cell C becomes large in the variation in the threshold voltage as Vpass increases in magnitude.

In writing a 0 into the cell A, the threshold voltages of the cells B and C vary in opposite directions with respect to the magnitude of the transfer voltage Vpass. With this in mind, therefore, the optimum value of Vpass should be determined so that variations in the threshold voltage of the cells B and C may both become small. The problem in self-boost writing through capacitive coupling and the problem in determination of the optimum value of Vpass will be described in detail later with reference to FIGS. 20A, 20B, 20C and 22.

Thus, if the transfer voltage Vpass is applied as word line voltages VWL1 and VWL3 to VWLn after the non-selected bit line BL2 has been made floating, the voltage at the channel and the source/drain diffused layer of each of the memory cells connected to the bit line BL2 and the word lines WL1 and WL3 to WLn is boosted through capacitive coupling to correspond with a boost in the transfer voltage Vpass.

FIG. 20A shows equivalent capacitance in the neighborhood of the gate of a memory cell transistor. The equivalent capacitance is given by a series combination of a capacitance C1 and a junction capacitance C2 as shown in FIG. 20B. The capacitance C1 consists of a series combination of a first capacitance formed by the channel, the first insulating film 4, and the charge storage layer 5 (FG) and a second capacitance formed by the charge storage layer 5, the second insulating film 6, and the control gate layer 7 (CG). The capacitance C2 is formed between the source/drain diffused layer 1a and the silicon substrate (p well) 1.

With voltage Vcg (word line voltage of FIG. 19) applied to the control gate layer 7, the channel of the memory cell transistor is supplied with the voltage Vch obtained by capacitive division of Vcg using C1 and C2 as shown in FIG. 20C. Here, C1/(C1+C2) is referred to as the boost ratio of the channel.

With the transfer voltage Vpass being applied as Vcg and the boosted channel voltage Vch having a desired positive value, charge injection into the non-selected cell B connected to the selected word line WL2 common to the selected cell A can be prevented.

Normally, the transfer voltage Vpass and the write voltage Vpp are applied using a step-up system in which their initial voltage, step voltage, final voltage and pulse width are optimized in order to make small a change in the threshold voltage of the cell A and prevent erroneous writing into the cells B and C.

Data written into the memory cells are erased by a simultaneous (at-one-time) erasing technique of erasing data in all the memory cells at one time or a block erasing technique of erasing data on a byte by byte basis.

For at-one-time erase, all the word lines are set to 0V, and a high voltage of, say, 20V is applied to the P well. This allows electrons to tunnel back from the charge storage layers of the memory cells to the P well, shifting the threshold voltage in the negative direction.

For block erase, all the word lines in a selected block are kept at 0V, all the bit lines, the source line, and the word lines in non-selected blocks are placed in the floating state, and a high voltage of, say, 20V is applied to the P well.

For data readout, a read voltage of, say, 4.5V is applied to the select gate and the non-selected word lines connected to non-selected memory cells to thereby turn them on, and the word line connected to the selected cell is kept at 0V. At this point, a current flows on the bit line side. By sensing a variation in the bit line voltage resulting from that current, either a 0 or a 1 is detected.

In the conventional self-boost writing NAND type EEPROM, the following problems have arisen in connection with the structure and manufacturing process of memory cells and the channel voltage applied to the channels of the NAND cells associated with non-selected bit lines. These problems will be described with reference to FIGS. 21 and 22.

FIG. 21 is a timing waveform diagram for use in explanation of the self-boost write operation. When the voltage VBL1 at the "0" write bit line BL1 is set at 0 V, the voltage VBL2 at the "1" write bit line BL2 is set at Vcc (say, 3.3V), and the voltage Vsg1 at the control gate SG1 on the bit line side is set at Vcc, the channels and the diffused layers of NAND cells associated with the bit line BL2 become floating.

After this, when Vpp is applied as the selected word line voltage VWL2 and Vpass as the non-selected word line voltages VWL1 and VWL3 to VWLn, the channels which have been placed in the floating state are boosted to a certain voltage Vch. At this point, the channel voltage Vch is given by $$Vch = Vsg - Vsgth\ (Vchinit) + Cr1 \times (Vpass - Vpassth - Vchinit) + Cr2 \times (Vpp - Vpassth - Vchinit) - (Tpw/16\ (Cins + Cch)) \times I \quad (1)$$

where Vsg corresponds to Vsg1 in FIG. 19 (for example, Vcc), Vsgth is the threshold voltage of the select gate cell S12 on the drain side when the channel voltage is Vchinit, Cr1 is the boost ratio of the memory cell channel when transfer voltage Vpass is applied, Cr2 is the boost ratio of the memory cell channel when write voltage pulse Vpp is applied, Vpassth is the voltage required to allow the memory cell supplied with transfer voltage Vpass to turn on when the channel voltage is Vchinit, Tpw is the pulse width of write voltage pulse Vpp, Cins is the capacitance per memory cell, Cch is the capacitance of the depletion layer below the channel, and I is the current flowing from the channel to the well and the adjacent bit line.

That is, as shown in the lower portion of FIG. 21, applying the write voltage Vpp to the selected word line WL2 as VWL2 and applying the transfer voltage Vpass to the non-selected word lines WL1 to WL3 to WLn as VWL1 and VWL3 to VWLn allows the channel voltage of the non-selected memory cells in the floating state to be boosted, preventing erroneous cell writing.

Changes in various process conditions, such as the impurity profile of the select gate cells, memory cells and semiconductor substrate (P well), the impurity profile of the cell channels through impurity implantation, the impurity profile of source/diffused layers of the cells and so on may result in the initial voltage Vchinit to the channels being lowered, the channel boost ratios being decreased due to an increase in the depletion capacitance or 0-V terminal-to-channel capacitance. In such case, a sufficiently high channel voltage Vch is not be obtained and the threshold voltage of memory cells connected to non-selected bit lines changes to cause erroneous cell writing.

A relationship between the transfer voltage Vpass and the threshold voltage of the cell B of FIG. 19 into which a 1 is to be written is illustrated by a solid line in FIG. 22. That is, writing into the cell A in the state where Vpass is low causes the threshold voltage of the cell B which was originally Vth1 for "0" writing to increase rapidly and exceed the boundary value between threshold voltages for "1" and "0" writing indicated by a dash-dotted line, which results in erroneous writing into the cell B. If, however, Vpass is set high enough, the channel voltage of the cell B is boosted and its threshold voltage Vth1 is therefore lowered again to Vthl, whereby erroneous writing is prevented.

With the cell C of FIG. 19, since 0V is transferred to its channel as described previously, setting Vpass applied to its control gate high causes the threshold voltage to increase as shown dashed in FIG. 22, resulting in erroneous cell writing. In order to prevent erroneous writing into all the non-selected memory cells, therefore, it is required that the range of Vpass be selected so that both the solid line and the broken line of FIG. 22 lie below the dash-dotted line.

A change in the threshold voltage tends to increase with increasing variations in the gate length and wing width of the memory cells (see FIG. 13), the tunnel oxide film, the inter-poly insulating film (the second gate insulating film 6) and is apt to take place particularly when a great number of bits is contained in a write selected block.

In addition, the greater the leakage current between the well and the floating channel or source/diffused layer, the greater the threshold voltage changes. Variations in characteristics of the select gate cells that transfer the bit line voltage to the channels also have a great influence on the threshold voltage. A change in the threshold voltage will further increase if the short-channel effect becomes less and less negligible as the fine pattern technology progresses further.

Thus, it has been made clear that the characteristics of memory cells and select gate cells associated with the structure and manufacturing process thereof affect the erroneous writing characteristic shown in FIG. 22. For improved performance, improvements in process, structure and operation are required.

From such a viewpoint, a local self boost (LSB) writing technique has been proposed conventionally. In FIG. 23, there is illustrated exemplary voltages applied to individual terminals in an LSB operation. In the LSB operation, 0 V is applied to the non-selected word lines WL1 and WL3 on opposite sides of the selected word line WL2 and Vpass is applied to the other non-selected word lines WL4 to WLn. The non-selected cell M(2,2) and so on that share the word line WL2 with the selected cell M(2,1) are cut off by the back-gate bias effect of the Vpass-boosted channel.

At this point, applying the write voltage Vpp to the selected cell M(2,1) allows the channel of the cell M(2,2) to be boosted in potential due to coupling between the channel capacitance and the source/drain diffusion capacitance of the cell M(2,2).

The resulting channel voltage of the cell M(2,2) is in the range of 8 to 9 V under the condition that Vpp is 18V and the channel boost ratio is 0.5 and serves as a write inhibit voltage. The LSB operation is promising for a method for writing into multi-valued memories but the following problems are involved:

That is, in the LSB operation, the non-selected memory cells M(2,2) and so on that share the word line WL2 with the selected memory cell M(2,1) must be in the cut-off state. In order for the non-selected cells M(2,2) and so on in the erase state to be cut off due to the channel back-gate bias effect, it is required that Vpass be high enough or the threshold voltage be low and negative.

However, with increasing Vpass, the threshold voltage of the memory cells M(4,1) to M(n,1) connected to the non-selected word lines WL4 to WLn cannot be kept from changing. In addition, it is very difficult to make the range over which the threshold voltage in the erase state is distributed small in view of restrictions on the operating time.

As described above, for the self-boost or LSB operation of NAND type EEPROM, the most desirable is to allow the memory cells and the select gate cells to have the common basic structure, to set the impurity profile of the channels and source/drain diffused layers of the memory cells so that a great channel boost ratio results, and to obtain a channel voltage high enough to ensure that erroneous writing into non-selected memory cells is prevented.

By making the channel voltage high, erroneous cell writing can be prevented even with a multi-valued memory in which the write voltage Vpp and the threshold voltage of non-selected cells are high. However, with 0.25 μm or less NAND type memories (the feature size of 0.25 μm or less) in particular, it is difficult to make the channel voltage high enough for the following reasons:

As described above in conjunction with FIGS. 12 and 14, the select gate cells of the conventional NAND type EEPROM have a two-layer gate structure of charge storage and control gate layers as with the memory cells and are used as select gates by making contact to the charge storage layer.

The select gate cells serve two functions of placing non-selected blocks in the cut-off state at read time and placing memory cells connected to non-selected bit lines in the floating state at write time.

The ion implantation conditions for the channels and source/drain diffused layers of the select gate cells and the impurity concentration of the well are set so as to serve the functions. With the progress of fine-pattern technology, it is desired to perform ion implantation into the channels and source/drain diffused layers of the select gate cells and the memory cells at the same time in the same process.

If, therefore, the ion implantation conditions for the channels and source/drain diffused layers of the select gate cells are set so as to serve their two functions, then the capacitances associated with the channel and source/diffused layers of each of the memory cells will increase. This results in the channel boost ratio being lowered and consequently in a failure to obtain a high channel voltage.

A key factor in self-boost and LSB operation is the channel boosting capability of the memory cells. Besides, in connection with the cut-off characteristic, it is also one of the important characteristics that the drain breakdown voltage is high.

In boosting the memory cell channel potential, the transfer voltage Vpass of the order of, say, 8V is applied to the select gate cell drain. At this point, punch-through takes place between the source and drain of the select gate cell. With an insufficient cut-off characteristic, an insufficient rise occurs in the memory cell channel potential simultaneously with the punch-through, resulting in erroneous cell writing.

The punch-through refers to the phenomenon in which the channel length shrinks, the drain depletion layer reaches the source diffused layer, and uncontrollable drain current flows to the source.

Therefore, it is required to avoid the punch-through and enhance the cut-off characteristic of the select gate cell satisfactorily. In general, in order to avoid the punch-through and enhance the cut-off characteristic of the select gate cell, it is effective to increase the impurity concentration below the channel and control the spread of depletion layer from the drain junction. Increasing the impurity concentration below the channel results in an increase in the threshold voltage.

With the gate length reduced as a result of the progress of fine structures of cells, to enhance the cut-off characteristic, it is required to perform ion implantation into the channel region at a higher dose. This results in a further reduction in the channel boost ratio, making it easy for erroneous cell writing to occur. In addition, with the progress of fine structures of cells, the short-channel effect increases variations in writing characteristic, which is a cause of increased erroneous cell writing.

With such ion implantation as meets the cut-off characteristic requirements of the select gate cell, the initial voltage transferred from the source or bit line through the select gate cell to the memory cell channel will be lowered, further lowering the channel voltage.

The ion implantation the conditions of which have been set based on the cut-off characteristic of the select gate cell into the memory cells causes their neutral threshold voltage to increase, resulting in read disturb. The read disturb refers to the change of the threshold voltage for a 1 of write data at data read time.

At this point, the writing characteristic of the memory cells is increased unnecessarily. This results in a great change in the threshold voltage of the memory cells supplied with the transfer voltage Vpass at write time. These problems are common to the self-boost writing and the LSB writing in NAND type EEPROM.

Thus, to enhance the cut-off characteristic of the select gate cell, the impurity concentration below the gate is required to be high and, to increase the channel boosting capability of the memory cells, the impurity concentration below the gate is required to be low. Heretofore, it has been impossible to optimize the characteristics of select gate cells and memory cells at the same time without performing ion implantation separately for each of the different types of cells. As described previously, separate ion implantation steps require additional mask alignment, offering a problem in high-density integration.

As described above, with the conventional EEPROM, the memory cells and the select gate cells are made different in gate structure, which constitutes a serious obstacle to achievement of higher integration density of EEPROM. In connection with this, the memory cells and the select gate cells have to be optimized in their impurity profile, gate oxide thickness, neutral threshold voltage and so on by the use of separate manufacturing processes.

BRIEF SUMMARY OF THE INVENTION

It is therefore an object of the present invention to provide an ultrahigh-integration EEPROM which allows select gate cells to have a two-layered gate structure of a charge storage layer and a control gate layer as in memory cells and allows the impurity profile, the gate insulating film thickness and the neutral threshold voltage to be set at the same time in the same process for the select gate cells and the memory cells.

Another object of the present invention is to provide an ultrahigh-integration EEPROM which can simultaneously satisfy conditions in self-boost and LSB operation that the cutoff characteristic of select gate cells is good enough at read time, the channel boost ratio of memory cells is high enough at read time, and the neutral threshold voltage of the memory cells which has a great effect on the memory cell write characteristic is adjustable.

The EEPROM of the present invention is characterized by allowing select gate cells to have a two-layered gate structure of a charge storage layer and a control gate layer as with memory cells and the threshold voltage of the select gate cells to be controlled through write and erase operations using the charge storage layer.

The cutoff characteristic of the select gate cells can be enhanced by charges injected into their charge storage layer; thus, the amount of impurities injected into the channels of the respective memory cells through ion implantation which is performed simultaneously on the select gate cells may be reduced.

Therefore, in the self-boost and LSB write operation of the EEPROM of the invention, the effect of boosting the channel potential of memory cells connected to non-selected bit lines can be enhanced to reduce erroneous writing significantly. The invention displays its effectiveness particularly for two-valued and multi-valued ultrahigh-integration EEPROMS having a feature size of 0.25 $\mu$m or less.

According to an aspect of the present invention there is provided a non-volatile semiconductor memory device comprising a memory cell array including NAND cells, each of the NAND cells having a plurality of memory cells and at least one of a first select gate cell and a second select gate cell, the plurality of memory cells being connected in series to form a NAND string, the first select gate cell being connected between the bit line and the memory cell nearest to the bit line, the second select gate cell being connected between the source line and the memory cell nearest to the source line, and each of the memory cells having a charge storage layer and a control gate layer, wherein each of the first select gate cell and the second select gate cell has a control gate layer and a charge storage layer each of which is of substantially the same dimension as that of the memory cells.

According to this configuration, the spacing of the control gate layers of the memory cells and the select gate cells can be made substantially uniform, ensuring that the occupied area of the cell array is reduced and the dimensional controllability is improved.

It is desirable that the control gate layer and the charge storage layer of each of the first and second select gate cells be of substantially the same dimension as that of the memory cells.

According to another aspect of the invention, there is provided a non-volatile semiconductor memory device comprising a memory cell array including NAND cells, each of the NAND cells having a plurality of memory cells and at least one of a first select gate cell and a second select gate cell, the plurality of memory cells being connected in series to form a NAND string, the first select gate cell being connected between the bit line and the memory cell nearest to the bit line, the second select gate cell being connected between the source line and the memory cell nearest to the source line, and each of the memory cells having a charge storage layer and a control gate layer, wherein each of the first select gate cell and the second select gate cell have a control gate layer and a charge storage layer, and in a data write mode for writing data into the memory cell array, a memory cell located on the bit line side of a non-selected memory cell to be not written which memory cell is connected to the same word line as a selected memory cell to be written or the first select gate cell and a memory cell located on the source line side of the non-selected memory cell or the second select gate cell are turned off.

This configuration allows writing into the memory cells to be performed in the self-boost or LSB manner. Thus, the column decoder can be formed using the Vcc power supply and the area of peripheral circuitry can be reduced. The EEPROM of the invention is very effective in the self-boost or LSB write operation.

According to still another aspect of the present invention there is provided a non-volatile semiconductor memory device comprising a memory cell array including NAND cells, each of the NAND cells having a plurality of memory cells and at least one of a first select gate cell and a second select gate cell, the plurality of memory cells being connected in series to form a NAND string, the first select gate cell being connected between the bit line and the memory cell nearest to the bit line, the second select gate cell being connected between the source line and the memory cell nearest to the source line, and each of the memory cells having a charge storage layer and a control gate layer, wherein each of the first select gate cell and the second select gate cell have a control gate layer and a charge storage layer, the memory cells and the first and second select gate cells are formed in each of the device regions defined by device isolation regions formed by filling isolation trenches extending along a direction of a semiconductor substrate with an insulating material, the charge storage layer of each of the memory cells and the first and second select gate cells is formed above the device region to self-align to the device region with a first gate insulating film interposed therebetween, the control gate layer of each of the memory cells and the first and second select gate cells is formed above the charge storage layer with a second gate insulating film interposed therebetween, the second gate insulating film covering the top and part of the sidewall of the charge storage layer, the charge storage layer is self-aligned to the isolation trenches, and has a lower portion contiguous to the device isolation region and an upper portion that is opposite to the control gate layer with the second gate insulating film interposed therebetween, and the height of the lower portion of the charge storage layer is substantially the same for the memory cells and the first and second gate cells.

This configuration allows the area of that sidewall of the charge storage layer which is opposed to the control gate layer to be the same for the select gate cells and the memory cells. Thus, the coupling ratio becomes the same for the select gate cells and the memory cells, allowing the threshold voltage of the select gate cells to be changed with ease.

It is desirable that the control gate layer and the charge storage layer of each of the first and second select gate cells be of substantially the same dimension as that of the memory cells.

According to a further aspect of the present invention there is provided a non-volatile semiconductor memory device comprising a memory cell array including NAND memory cells, each of the NAND memory cells having a plurality of memory cells and at least one of a first select gate cell and a second select gate cell, the plurality of memory cells being connected in series between a bit line and a source line, the first select gate cell being connected to and between the bit line and the memory cell nearest to the bit line, the second select gate cell being connected to and between the source line and the memory cell nearest to the source line, and each of the memory cells having a charge storage layer and a control gate layer, wherein each of the first select gate cell and the second select gate cell has a control gate layer and a charge storage layer, a plurality of transfer transistors are provided, each of which is connected in parallel with a corresponding respective one of the memory cells and the first and second select gate cells, and the threshold voltage of the transfer transistors is substantially equal to that of at least one of the first and second select gate cells.

According to this configuration, in the event that the threshold voltage of the select gate cells goes higher than the value preset through writing, the voltage transfer can be made via the parallel connected transfer transistor, preventing erroneous operation.

It is desirable that the control gate layer and the charge storage layer of each of the first and second select gate cells be of substantially the same dimension as that of the memory cells.

It is desirable that the memory cells and the first and second select gate cells be formed in each of device regions defined by device isolation regions formed by filling isolation trenches extending along a direction of a semiconductor substrate with an insulating material, the charge storage layer of each of the memory cells and the first and second select gate cells be formed above the device region to self-align to the device region with a first gate insulating film interposed therebetween, the control gate layer of each of the memory cells and the first and second select gate cells be formed above the charge storage layer and the device region with a second and a third gate insulating film interposed therebetween, the second gate insulating film covering the top and sidewall of the charge storage layer and the third gate insulating film covering the upper portion of the device region, and the transfer transistor MOS structure be formed by making the control gate layer and the upper portion of the device region opposite to each other with the third gate insulating film thicker than the first insulating film interposed therebetween.

This allows each of the transfer transistors connected in parallel with a respective one of the memory cells and the select gate cells to have a self-aligned structure suitable for fine pattern formation.

It is desirable that the charge storage layer of at least one of the first and second select gate cells be of substantially the same dimensions as that of the memory cells.

This allows the drain breakdown voltage of the select gate cells on the source line side to be increased at the time of writing into the memory cells and variations in the threshold voltage after writing to be reduced.

It is desirable that each of the memory cells and the first and second gate cells have substantially the same impurity profile in the direction of depth of its channel region below the charge storage layer.

This eliminates the need of performing ion implantation separately on the select gate cells and the memory cells because the impurity profile below the charge storage layer is the same for those cells.

It is desirable that the neutral threshold voltage of the first and second select gate cells be substantially equal to that of the memory cells.

This allows the memory cells to have an equal coupling ratio, which allows the threshold voltage of the select gate cells to be changed readily through writing.

It is desirable that the spacing between the control gate layers and between the charge storage layers of adjacent select gate and memory cells and the spacing between the control gate layers and between the charge storage layers of adjacent memory cells be substantially equal to one another.

This allows the occupied area of the memory cell array to be reduced and the dimensional controllability to be improved.

It is desirable that the thickness of the gate insulating film between the charge storage layer of at least one of the first and second select gate cells and the semiconductor substrate be substantially equal to that of the corresponding insulating film in the memory cells.

This allows the threshold voltage of the select gate cells to be set at a desired value through ion implantation into the charge storage layer thereof.

It is desirable that the threshold voltage of the first and second select gate cells be determined by the amount of charge stored on their charge storage layer.

This allows the select gate cells to have the same gate structure as the memory cells to allow for writing and erasing thereof. Thus, a memory cell array can be provided in which no erroneous writing occurs.

It is desirable that a reference voltage be applied to corresponding select gates to the first and second select gate cells and a higher voltage than the reference voltage be applied to a well formed in the semiconductor substrate to thereby erase the first and second select gate cells simultaneously with the memory cells.

It is desirable that writing into the first and second select gate cells be performed prior to writing into the memory cells.

It is desirable that writing into the second select gate cell be performed prior to writing into the first select gate cell.

This allows for selective writing and reading of the memory cells in the same manner as before.

It is desirable that the threshold voltage of the first select gate cell after writing thereinto be lower than that of the second select gate cell after writing thereinto.

This is based on the following reason: The select gate cells on the bit line side must be cut off only when the supply voltage Vcc is applied to both the select gates and the bit lines. The lower threshold voltage the select gate cells have and therefore the higher transfer capability they have, the less easy it becomes for erroneous writing to occur. On the other hand, it is preferable that the threshold voltage of the select gate cells on the source line side be a little high because they are cut off at the time of both reading and writing.

It is desirable that writing into the second gate cells in at least the same column is performed at one time for all blocks.

This allows a positive threshold voltage to be imparted to all the select gate cells on the source line side at the time of writing and reading, allowing for normal write and read operations.

It is desirable that writing into the first and second select gate cells be performed using a write voltage that changes in a stairstep-like manner from an initial voltage, and the written state is read at each step for write verification.

This allows variations in the threshold voltage of the select gate cells to be reduced as with the memory cells.

It is desirable that ion implantation into channel regions and diffused layers of the first and second gate cells and the memory cells be performed in the same process.

This allows the ion implantation into the channels and diffused layers of the select gate cells and the memory cells to be performed at the same time in the same process, offering advantages to fine pattern formation.

It is desirable that the formation of the gate insulating film between the charge storage layer and the semiconductor substrate be performed in the same process for the first and second select gate cells and the memory cells.

This allows the gate insulation films of the select gate cells and the memory cells to be formed at the same time in the same process, offering advantages to fine pattern formation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5A shows applied voltages to an equivalent circuit of an EEPROM according to a third embodiment of the present invention at the time of writing into the select gate cells on the source line side;

FIG. 5B shows applied voltages to the equivalent circuit of an EEPROM of the present invention at the time of writing into the select gate cells on the bit line side;

FIG. 5C shows applied voltages to the equivalent circuit of an EEPROM of the present invention at the time of at-one-time erasing of the cells including the select gate cells;

FIGS. 20A, 20B, 20C are diagrams for use in explanation of the channel boost ratio;

FIG. 21 is a timing diagram of applied voltages to the prior art EEPROM in the self-boost write operation;

DETAILED DESCRIPTION OF THE INVENTION

Figure 1:
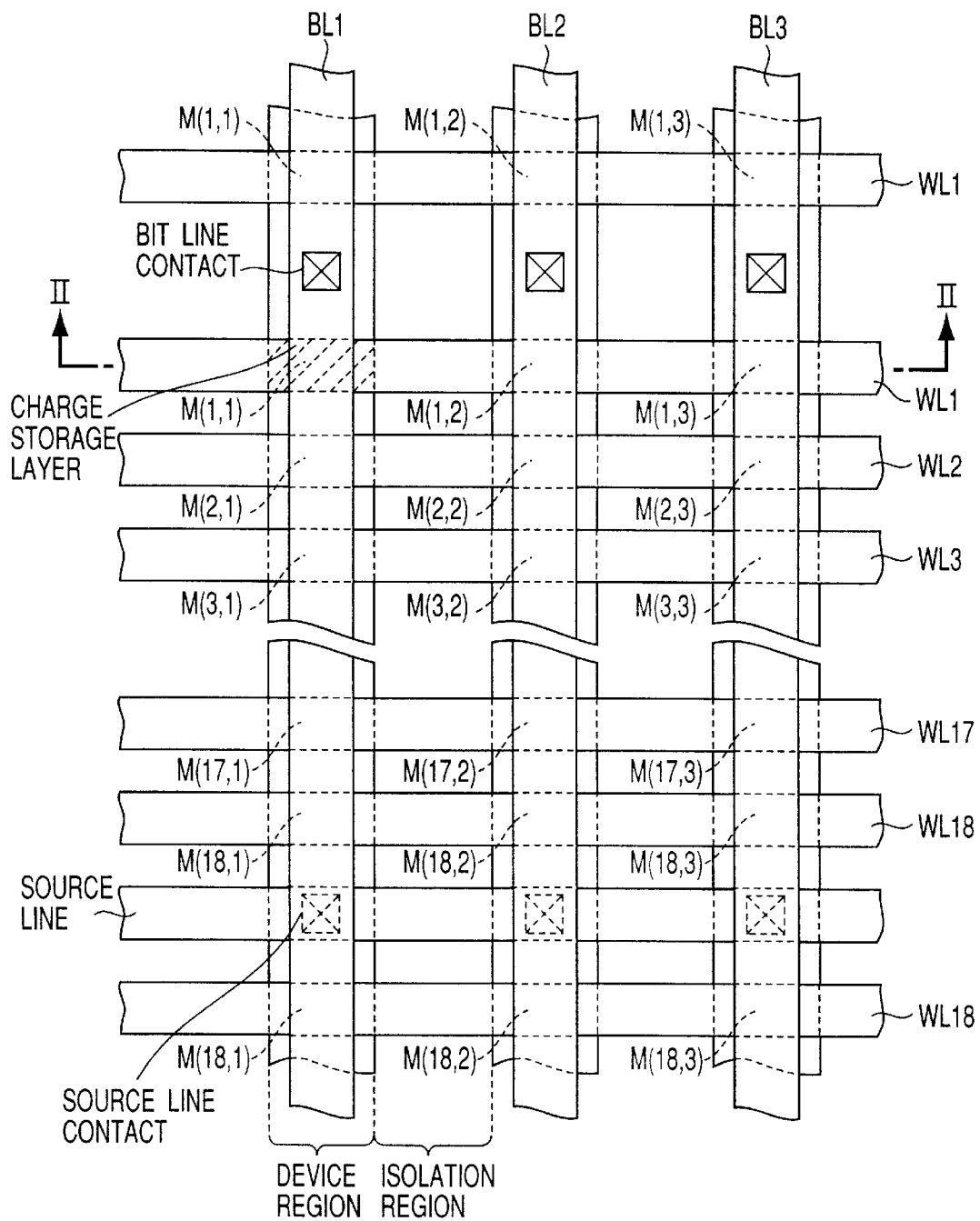
FIG. 1 is a fragmentary plan view of an EEPROM according to a first embodiment of the present invention.

Referring now to FIG. 1, there is illustrated a fragmentary plan view of an EEPROM according to a first embodiment of the present invention. This example is directed to a NAND type EEPROM.

Between a corresponding bit-line contact and a corresponding source-line contact are arranged 18 series-connected memory cells M(1,1), M(2,1), . . . , M(18,1) in the first column to thereby form one NAND type memory cell (NAND memory cell). Likewise, memory cells M(1,2), M(2,2), . . . , M(18,2) in the second column form one NAND memory cell, memory cells M(1,3), M(2,3), . . . , M(18,3) in the third column form one NAND memory cell, and so forth. Only three NAND memory cells are shown in FIG. 1. This is, however, only for simplicity of illustration. Those of the cells which are adjacent to the bit-line contact or the source-line contact are used as select gate cells and the other cells are used as memory cells. In practice, more number of NAND memory cells are provided. Such NAND memory cells are arranged in the row direction to form a portion of a memory cell array. A plurality of such array portions are also arranged in the column direction to form one memory cell array in such a scheme that each NAND memory cell is folded back up and down in the column direction along a corresponding line of bit line contacts and a corresponding line of source line contacts. The bit line contacts are connected to the bit lines BL1, BL2, BL3, etc., and the source line contacts are connected together to a corresponding source line.

Control gate layers of those of the memory cells which are arranged in the same row constitute a corresponding one of the word lines WL1, WL2, . . . , and WL18. The direction of the row is substantially perpendicular to the direction of bit line length. Further, each memory cell has a charge storage layer below the control gate layer as shown hatched by broken lines at M(1,1).

Figure 11:
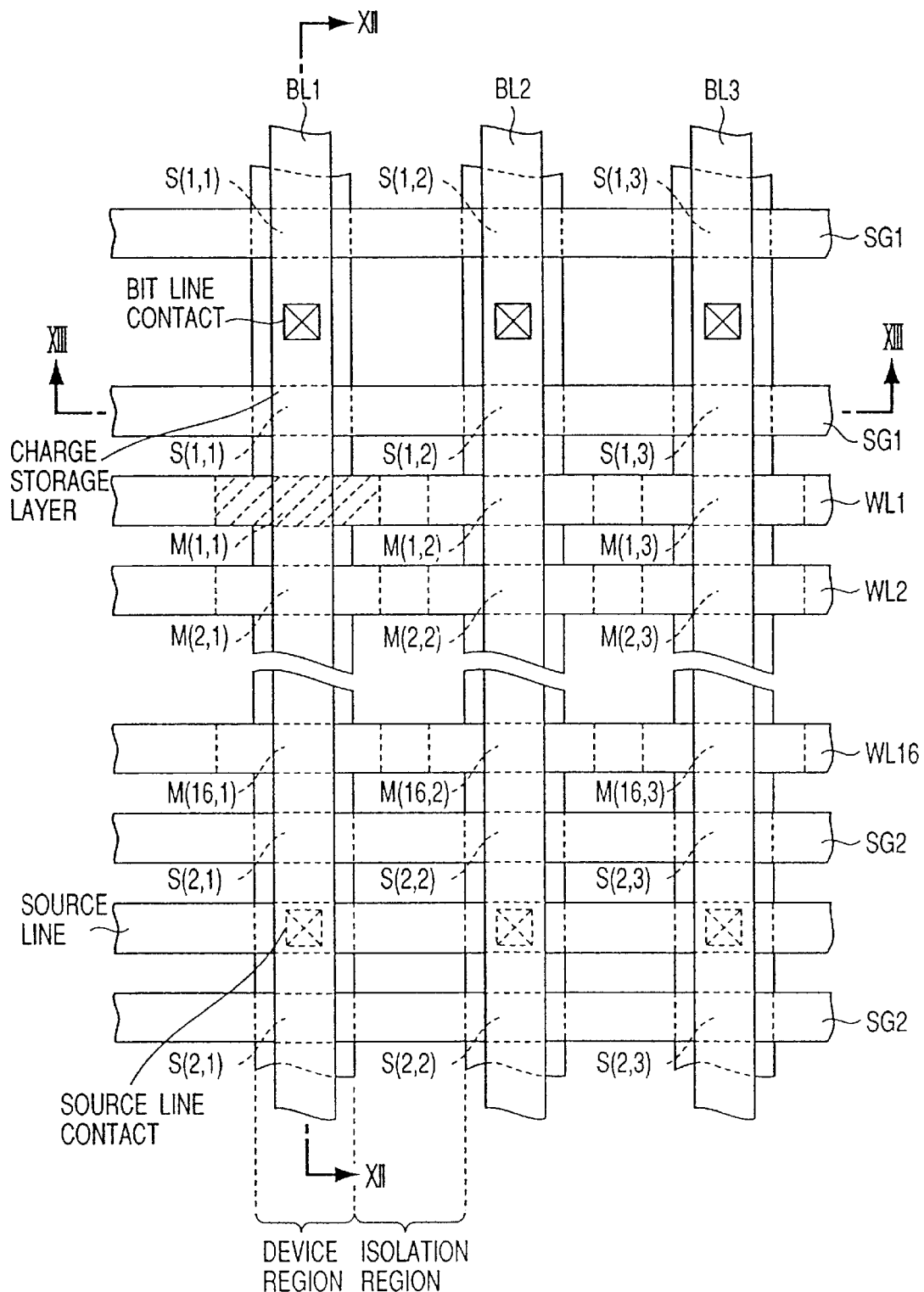
FIG. 11 is a fragmentary plan view of a prior art EEPROM.

Note here that the conventional EEPROM shown in FIG. 11 is equipped with the select gate cells S(1,1), S(1,2), S(1,3), etc. adjacent to the bit line contacts and the select gate cells S(2,1), S(2,2), S(2,3), etc. adjacent to the source line contacts and these select gate cells have a gate structure different from that of the memory cells M(i, j). These select gate cells have a gate structure in which the gate electrode is made of a single layer. The single layers of the select gate cells S1,1, S1,2, S1,3, etc. arranged in the same row form the select gate SG1, and the single layers of the select gate cells S2,1, S2,2, S2,3, etc. arranged in the same row form the select gate SG2.

In contrast, the EEPROM shown in FIG. 1 is constructed such that all the cells between the bit-line and source-line contacts have the same gate structure and those of the cells which are adjacent to the bit-line contact or the source-line contact are used as select gate cells and the other cells are used as memory cells.

Thus, each of the select gate cells also has a charge storage layer. In write and read operations, WL1 and WL18 are used as select gates SG1 and SG2 and WL2 to WL17 are used as word lines for the memory cells.

Figure 2:
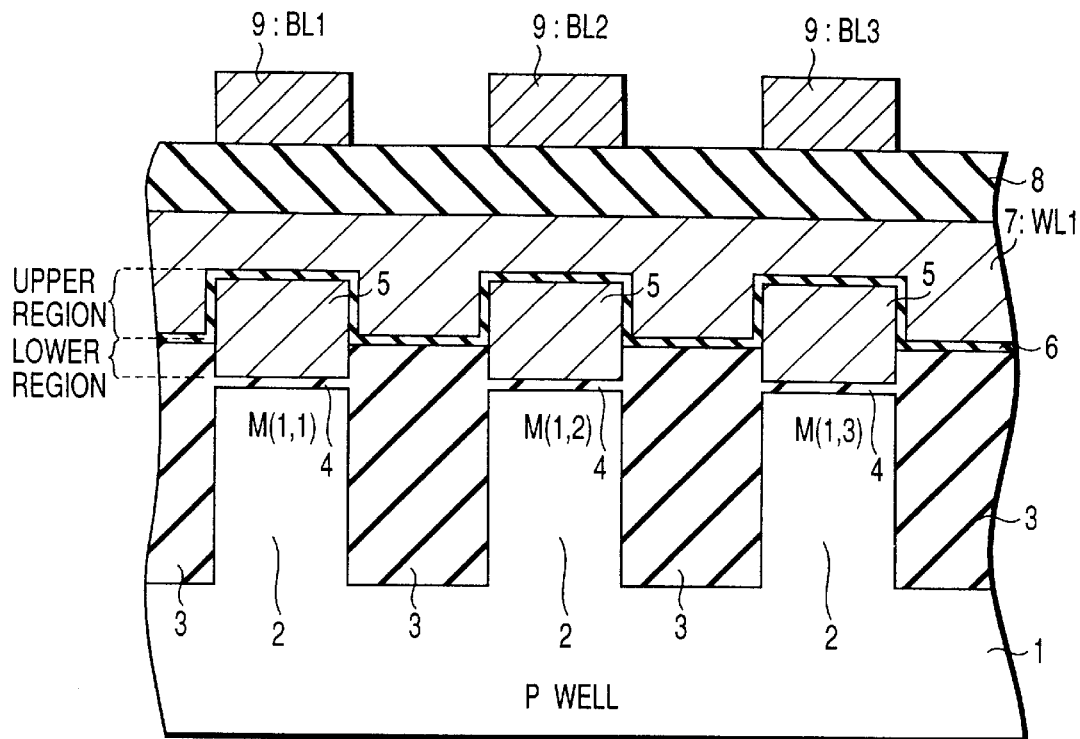
FIG. 2 is a sectional view taken along II—II of FIG. 1.

FIG. 2 is a cross sectional view taken along line II—II of FIG. 1. In this diagram, the cross sectional structure of the select gate cells M(1,1), M(1,2) and M(1,3) adjoining the bit line contacts are shown. The cross sectional structure is the same for all the memory cells M(i, j) (i=1 to 18, j=1 to 3).

Figure 12:
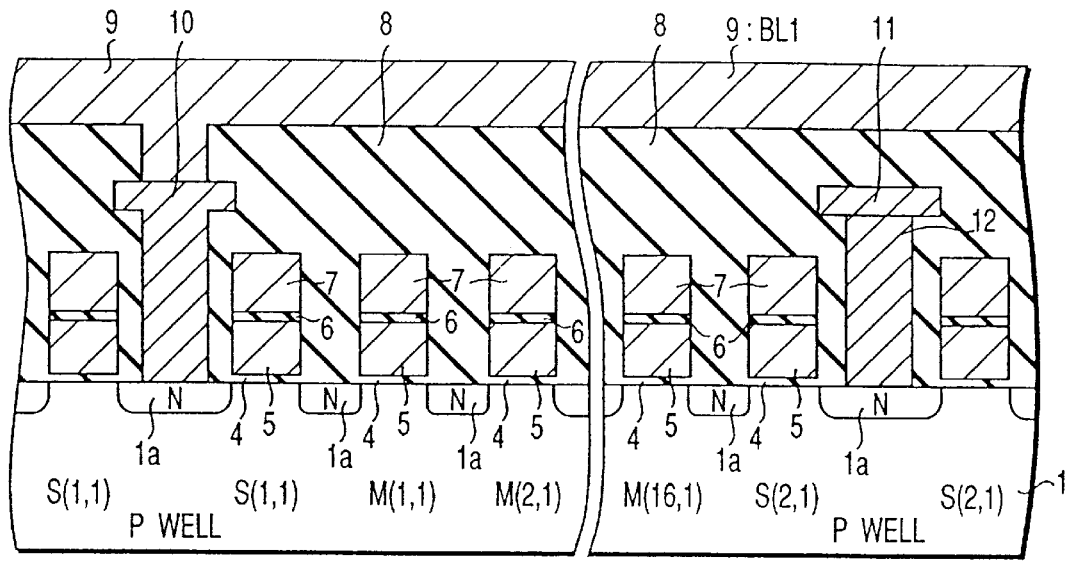
FIG. 12 is a sectional view taken along line XII—XII of FIG. 11.

As shown in FIG. 1, in the cross sectional structure, isolation trenches are formed in a silicon substrate 1 (P well), thus forming device regions 2 which form channel regions of the respective select gate cells M(1,1), M(1,2), and M(1,3). In the source/drain regions of adjoining each device region which exist in the direction perpendicular to drawing paper are formed source/drain diffused layers. Those of the device regions arranged in the same column are connected in series through the source/drain diffused layers to form a NAND memory cell. First ends of the bit line side of the NAND memory cells are connected to a corresponding bit line through the bit line contacts, and, the other ends of the source line side of the NAND memory cells are connected to a common source line through the source line contacts (see FIG. 12).

An insulating material of SiO2 or the like is buried in the isolation trenches to form device isolation regions 3 that isolate the adjacent NAND memory cells from each other. At this point, the top of the insulating material is set above the top of the device regions 2.

Charge storage layers 5 are formed over the device regions 2 with a first thin gate insulating film 4 interposed therebetween. A continuous control gate layer 7 (WL1) is formed over the charge storage layers 5 and the device isolation regions 3 filled with the insulating material with a second gate insulating film 6 interposed therebetween, which is thicker than the first gate insulating film 4. Reference numeral 8 denotes an inter-layer insulating film and 9 denotes the bit lines BL1, BL2 and BL3 extending in the direction perpendicular to the drawing.

Figure 13:
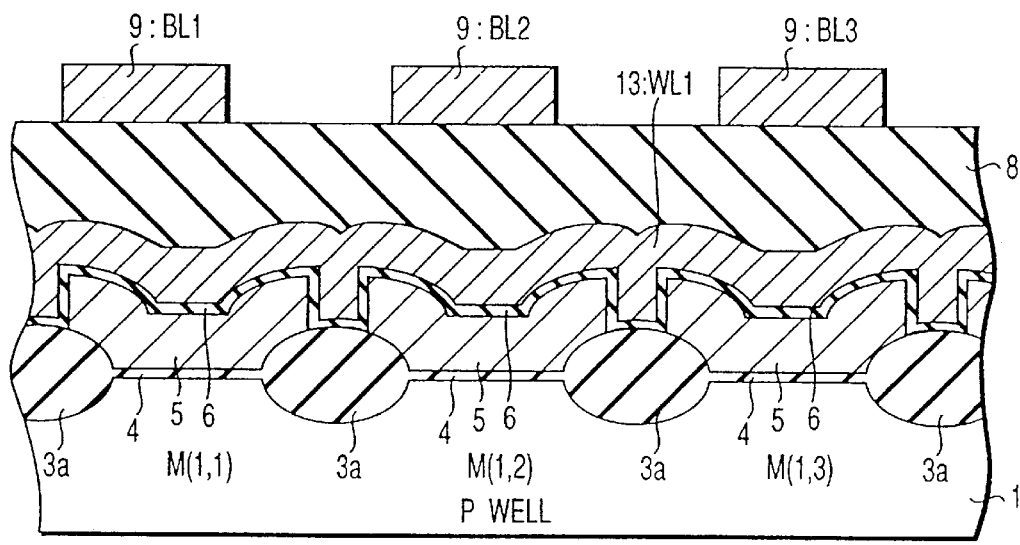
FIG. 13 is a sectional view taken along line XIII—XIII of FIG. 11.
Figure 14:
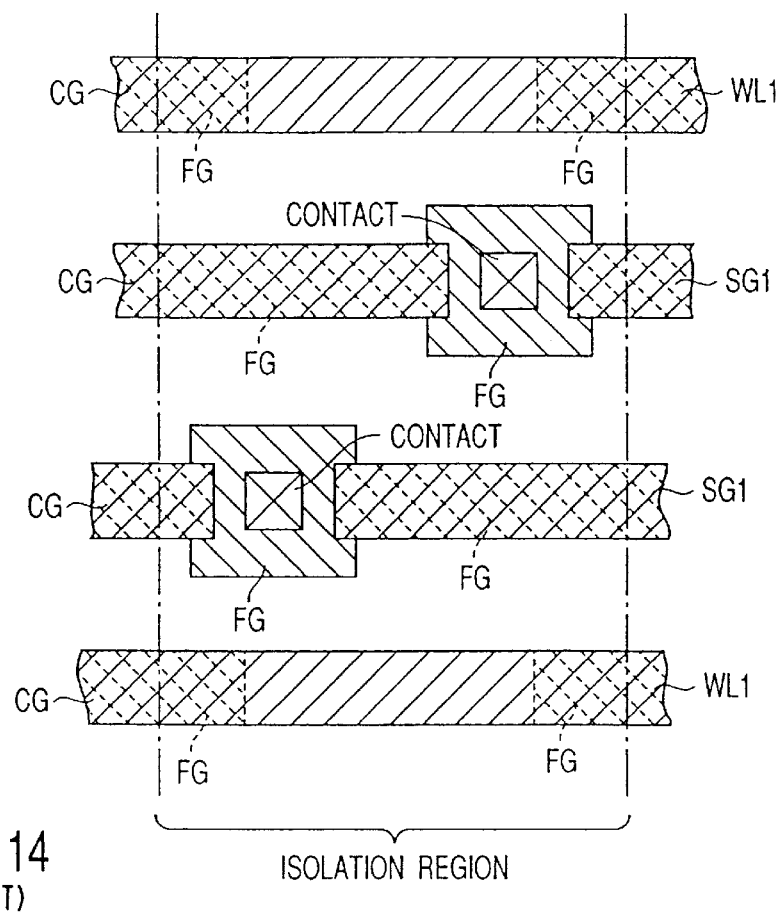
FIG. 14 shows contacts to charge storage layers of the conventional select gate cells.
Figure 15:
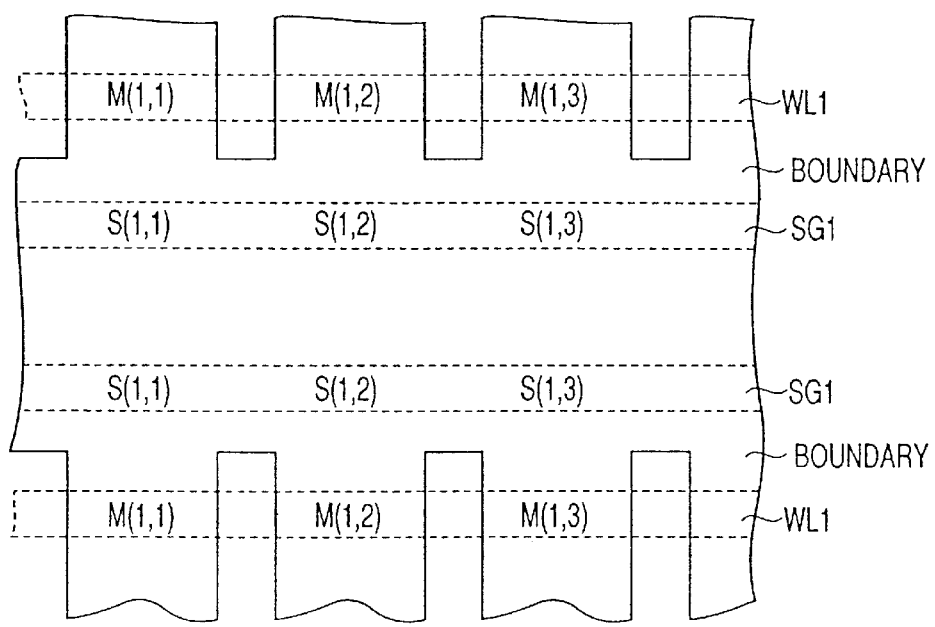
FIG. 15 is a fragmentary plan view of a mask used in patterning the conventional charge storage layers.
Figure 16:
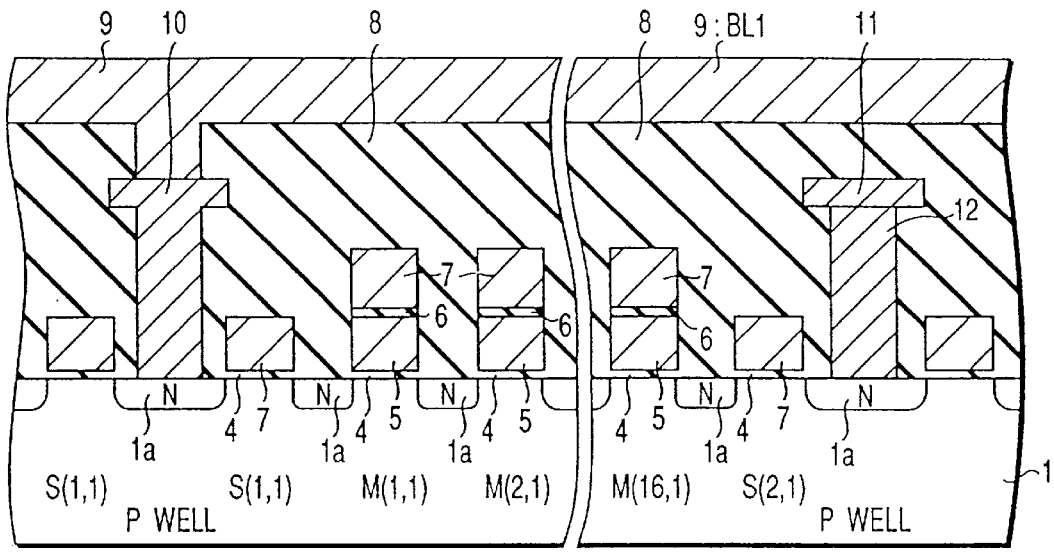
FIG. 16 is a view similar to that of FIG. 12 and illustrates another conventional EEPROM.
Figure 17:
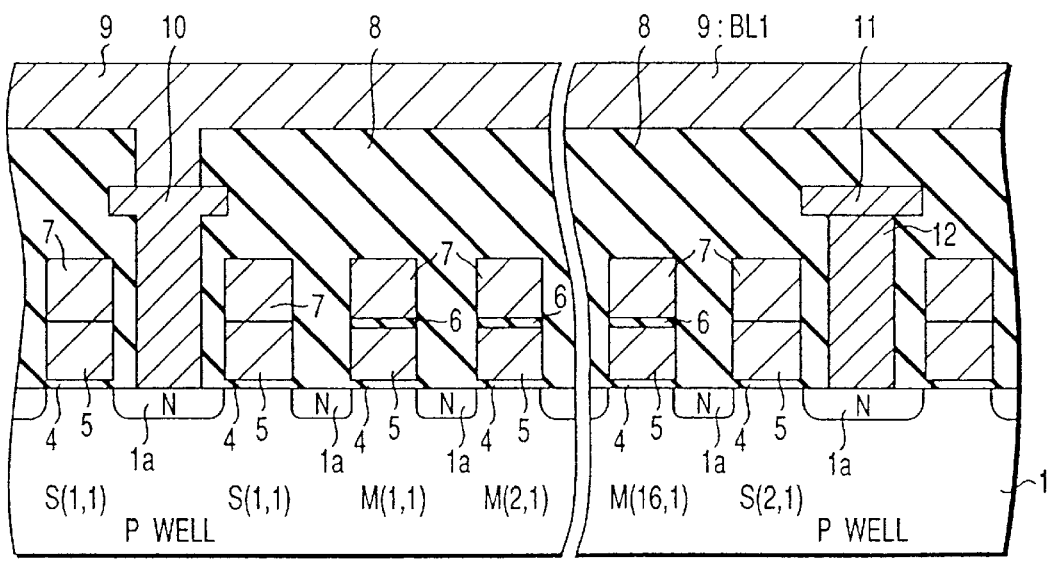
FIG. 17 is a view similar to that of FIG. 12 and illustrates still another conventional EEPROM.
Figure 18:
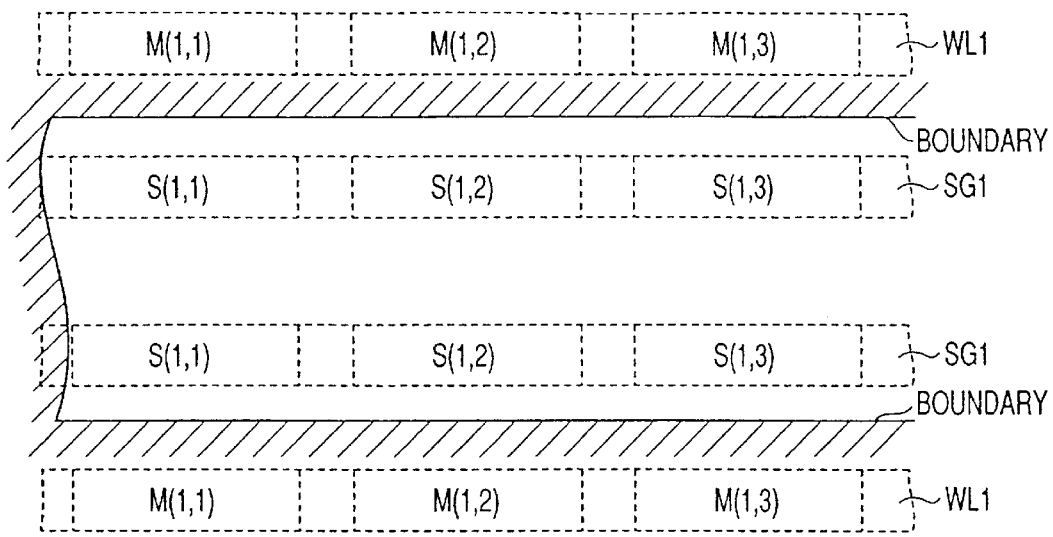
FIG. 18 is a fragmentary plan view of a mask used in patterning the conventional gate insulating film.

The sectional structure of FIG. 2 is characterized in that, unlike the sectional structure of cells with isoplanar device isolation regions 3a as shown in FIG. 13, the charge storage layers 5 are formed to self-align to the device isolation regions 3. Because all the memory cells have the same structure, the self-aligned process allows the spacing of the memory cells in the direction of bit line length and the spacing of the NAND memory cells in the direction of word line length to be approached to limits in lithography. This is very favorable to high-density integration.

As shown in FIG. 2, the charge storage layer 5 is divided into a lower portion covered with the insulating material in the device isolation regions 3 and an upper portion that is opposite to the control gate layer 7 with the second gate insulating film 6 interposed. Controlling the dividing ratio allows the cell coupling ratio to be changed.

In the first embodiment, the height of the upper portion is the same for all the memory cells including select gate cells.

Thus, the coupling ratio is the same for all the memory cells. This facilitates threshold voltage control through writing into the select gate cells as will be described later.

In the EEPROM of the invention, like the memory cells, the select gate cells have a two-layered gate structure of a control gate layer and a charge storage layer. Thus, the threshold voltage of the select gate cells can be readily set by the amount of charge stored on their charge storage layer as with the memory cells by making their associated first gate insulating film substantially equal in thickness to that of the memory cells. The threshold voltage of the select gate cells at read/write time can therefore be readily optimized. The operation of the EEPROM of the invention will be described sequentially in the following embodiments.

A second embodiment of the present invention is described with reference to FIGS. 3 and 4. The following embodiment is effective for all of EEPROMs that use the self-boost writing scheme with no dependence on the structure of memory cells, LOCOS, the device isolation structure, the structure and number of select gate cells, the number of items of data which can be stored in memory cells in multi-valued memory, and the manufacturing method.

In the second embodiment, the memory cell operation will be described in terms of the EEPROM of the first embodiment. The memory cell operation described herein is not necessarily limited to the EEPROM of the first embodiment. A similar operation is possible provided that the select gate cells contain a charge storage layer.

The operation of the EEPROM of the second embodiment is based on the assumption that the threshold voltage of the select gate cells is set in advance to the optimum value using the method described in connection with a third embodiment.

Figure 3:
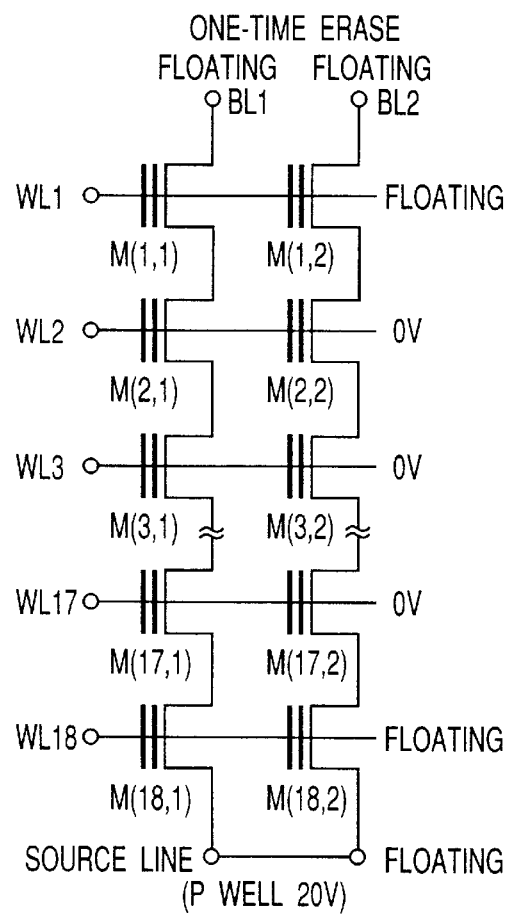
FIG. 3 shows an equivalent circuit of an EEPROM according to a second embodiment of the present invention and applied voltages in at-one-time erase.

FIG. 3 shows part of an equivalent circuit of the memory cell array in the second embodiment and voltages applied to various parts for simultaneous erasing. A NAND memory cell consisting of M(1,1) to M(18,1) is connected between the bit line BL1 and the common source line and a NAND memory cell consisting of M(1,2), to M(18,2) is connected between the bit line BL2 and the common source line.

In FIG. 3, two NAND memory cells each consisting of 18 cells are shown connected in parallel to the common source line. In general, m NAND memory cells each consisting of n memory cells can likewise be subjected to simultaneous erasing where m, n are each an integer greater than one.

All the memory cells have a charge storage layer and a control gate layer and the control gate layer is shared by memory cells arranged in the row direction to form one of the word lines WL1 to WL18.

First, the erase operation in the second embodiment will be described using FIG. 3. The erasing is performed on a block-by-block basis or on an all-block-at-one-time basis (the entire chip is erased at one time). The data in a memory cell is erased by tunneling back charges from the charge storage layer to the silicon substrate. When a high negative voltage of, say, −20V is applied to the control gate layer (word line) associated with a memory cell to be erased and the substrate is kept at a reference voltage of, say, 0V, a voltage of the order of −12V is applied to the charge storage layer through capacitive coupling.

At this point, a high electric field of more than 10 MV/cm is applied across the first gate insulating film 4 of the order of 10 nm in thickness, so that electrons are tunneled back from the charge storage layer to the silicon substrate. For this reason, the threshold voltage of that memory cell is shifted in the negative direction.

Thus, the memory cell is placed in the normally on state and application of the reference voltage (0V) to the control gate layer causes a current flow between the source and drain. The memory cell can also be erased by applying the reference voltage to the control gate layer and a high positive voltage of 20V to the silicon substrate.

In actual EEPROMs, block erase is performed in blocks of memory cells corresponding to some kilobytes. Voltages applied to the various parts in the equivalent circuit for block erase are illustrated in FIG. 3 by example.

With the silicon substrate set at 20V, the word lines WL2 to WL17 set at 0V, and the select gates WL1 and WL2, the source line and the bit lines BL1 and BL2 kept floating, a high electric field is applied between the charge storage layer of each of the memory cells M(2,1) to M(17,1) and M(2,2) to M(17,2) and the substrate, so that these memory cells are erased at one time.

The select gate cells M(1,1), M(18,1), M(1,2) and M(18,2) are self-boosted through capacitive coupling with the P well because the select gates WL1 and WL18 are kept floating, so that no high electric field is applied between the charge storage layer and the P well. Thus, no charge transfer occurs and the previously set threshold voltage of the select gate cells does not shift.

Next, the write operation will be described with reference to FIG. 4A. Here, a method is illustrated which makes a selection between the bit lines by applying 3V to one bit line and 0V to the other. The bit line selection can be made from the source line side in the same way.

Figures 4A, 4B:
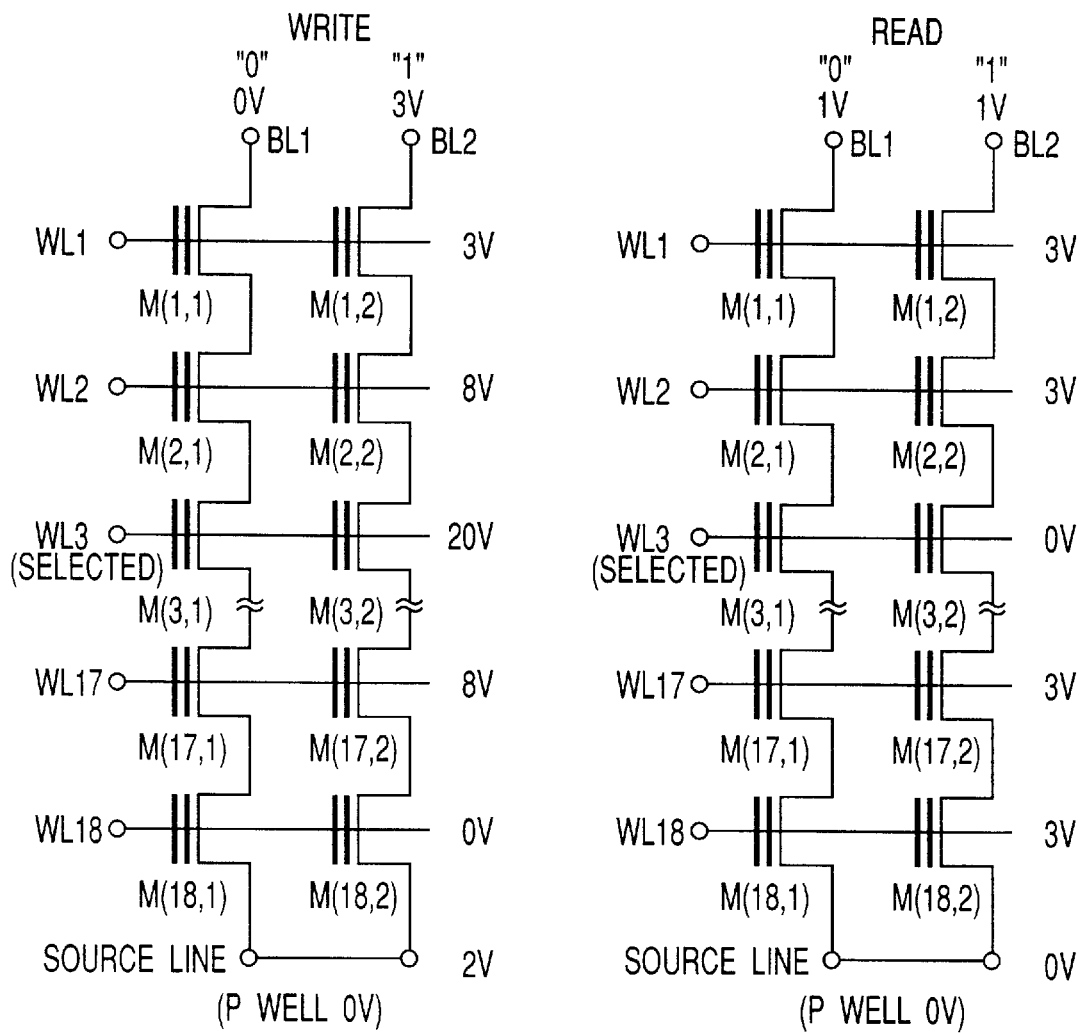
FIG. 4A shows applied voltages to the equivalent circuit of FIG. 3 in a write operation.
FIG. 4B shows applied voltages to the equivalent circuit of FIG. 3 in a read operation.

FIG. 4A shows part of an equivalent circuit of the EEPROM and exemplary voltages applied to the associated terminals in a write operation. Contrary to cell erasing, cell writing is performed by tunneling electrons to the charge storage layer and shifting the threshold voltage of the cell in the positive direction. With the threshold voltage thus shifted, the cell is placed in the normally off state. Thus, when the reference voltage 0V is applied to the control gate layer, the memory cell is turned off with the result that no current flows between the source and drain.

Data writing is performed on all the memory cells connected to the selected control gate layer (here, the word line WL3) at the same time. Writing of two-valued data of either a 0 or a 1 will be described herein.

In FIG. 4A, writing of a 0 is performed on the memory cell M(3,1) connected to the bit line BL1 and the selected word line WL3. A 0 is written into the memory cell by shifting its threshold voltage in the positive direction. At this point, a high positive voltage of, say, 20V is applied to the selected word line WL3 and the reference voltage 0V is applied to the silicon substrate.

In FIG. 4A, writing of a 1 is performed on the memory cell M(3,2) connected to the bit line BL2 and the selected word line WL3. In the 1 written state, the threshold voltage of the memory cell remains unchanged (the cell is maintained in the erase state). In order not to cause electrons to tunnel to the charge storage layer of the memory cell M(3,2) even with 20V applied to the control gate layer, the channel of that memory cell is supplied with a first intermediate voltage (say, 6V) which is higher than the reference voltage 0V but lower than the control gate voltage 20V. Thereby, the electric field between the charge storage layer and the silicon substrate is lowered and hence tunneling of electrons to the charge storage layer is disabled.

Thus, the reference voltage 0V or the first intermediate voltage 6V must be applied to the channel of each of the memory cells M(3,1) and M(3,2) connected to the selected word line WL3 according to data to be written. To this end, a second intermediate voltage of, say, 8V is applied to the non-selected word lines WL2 and WL4 to WL17.

The bit line BL1 for writing a 0 is set at 0V. To transfer 0V to the diffused layers and the channel of a selected memory cell, a positive voltage of 3V higher than the threshold voltage must be applied to the select gate WL1 adjacent to the bit line contact.

As described previously, the first intermediate voltage 6V must be applied to the bit line BL2 for 1 writing. To this end, the select gate cells M(1,2) and M(18,2) on the bit line and source line sides are turned off to keep the channels and diffused layers of all the intermediate memory cells M(2,2) through M(17,2) floating. In this state, application of the second intermediate voltage to their control gate layer allows their channel to be set at 6V, the first intermediate voltage.

That is, as described above in connection with FIG. 20, the channel and source/drain diffused layer in the floating state form capacitance with the P well. Thus, if the control gate layer is raised to the second intermediate voltage 8V or the write voltage 20V, a rise in voltage is capacitive-divided by the gate capacitance and the channel/diffused layer capacitance, allowing the channel voltage to be self-boosted. For this reason, the channel can be set at 6V without applying the first intermediate voltage 6V to the channel directly from outside.

To this end, a voltage lower than the threshold voltage is applied to the select gate WL18 to thereby turn off the select gate cells M(18,1) and M(18,2). To transfer 0V applied to the 0 writing bit line BL1, a voltage higher than the threshold voltage is applied to the select gate WL1.

For this reason, the supply voltage 3V is applied to the select gate WL1 and the 1 writing bit line BL2. As a result, the select gate cell M(1,2) becomes cutoff when the difference between the supply voltage and the threshold voltage is applied to the channels of the memory cells M(2,2) to M(17,2), so that these memory cells become floating.

By applying the second intermediate voltage 8V or the write voltage 20V to the control gate layers with the channels and the diffused layers of the memory cells M(2,2) to M(17,2) kept floating to thereby set their channels at 6V, the memory cell M(3,2) connected to WL3 can be placed in the 1 written state (tunneling of electrons to the charge storage layer is disabled).

Next, a read operation will be described with reference to FIG. 4B, which shows part of an equivalent circuit of the EEPROM and exemplary voltages applied to the associated terminals in a read operation. Data reading is performed by applying an intermediate voltage (say, the reference voltage 0V) between the negative threshold in the erase state and the positive threshold voltage in the 0 written state to the control gate of a memory cell to be read from and detecting the presence or absence of a current flow in the bit line.

It is therefore required that the select gate cells connected to WL1 and WL18 and the memory cells connected to the non-selected word lines WL2 and WL4 to WL17 be all turned on. To this end, a low positive voltage (say, 3V) is applied to WL1, WL18, WL2 and WL4 to WL17.

The low positive voltage must be set higher than the highest threshold voltage of those of the memory cells in the 0 written state. By so doing, the cell M(2,1) can be rendered conductive even if it is in the 0 written state. With the cell M(3,1) to be read from, the associated word line WL3 is set at 0V, so that it turns off. Thus, the 0 in M(3,1) can be read through the bit line BL1.

A third embodiment of the present invention will be described next with reference to FIG. 5. In the third embodiment, a description is given of a method to optimize the threshold voltage of a select gate cell having a charge storage layer by pre-writing into it.

As described previously, at write time memory cells connected to non-selected bit lines must be in the floating state. For this reason, select gate cells are provided adjacent to the bit line and source line contacts and the conduction of the select gate cells is controlled.

With a memory cell array of this embodiment, the memory cells M(18,1) and M(18,2) adjacent to the source line contacts and the memory cells M(1,1) and M(1,2) adjacent to the bit line contacts are written into previously to have a threshold voltage most suitable for serving the function of select gate cells. The pre-writing is performed in the following manner.

In FIG. 5A there are illustrated voltages applied to the terminals in an equivalent circuit of part of the memory to change the threshold voltage of the memory cells M(18,1), M(18,2) etc. adjacent to the source line contacts. A high positive voltage of, say, 20V is applied to the select gate WL19 on the source side and the reference voltage 0V is applied to the bit lines BL1 and BL2. At this point, the word lines WL2 to WL17 and the select gate WL1 on the bit line side are kept at 0V. In this manner, the memory cells M(18,1), M(18,2), etc. connected to the source-side select gate WL18 are subjected to simultaneous writing by way of example.

In FIG. 5B there are illustrated voltages applied to an equivalent circuit of part of the memory to change the threshold voltage of the memory cells M(1,1), M(1,2) etc. on the bit line side. A high positive voltage of, say, 20V is applied to the select gate WL1 on the bit line side and the reference voltage 0V is applied to the bit lines BL1 and BL2. At this point, the word lines WL2 to WL17 and the select gate WL18 on the source side are kept at 0V. In this manner, the memory cells M(1,1), M(1,2), etc. connected to the bit line-side select gate WL1 are subjected to one-time (simultaneous) or block writing.

The memory cells, M(1,1), M(1,2), M(18,1), M(18,2), etc., do not always have the same threshold voltage in the initial state immediately after manufacture. It is therefore desirable that the memory cell array be subjected to at-one-time erase prior to that writing. In this case, unlike at-one-time erase for data rewrite when the memory is in use, the select gates WL1 and WL18 are set at 0V as shown in FIG. 5C.

Although, in this case, it is desirable that the neutral threshold voltage of the select gate cells be set substantially equal to the neutral threshold voltage of the memory cells, the former threshold voltage may be set higher than the latter to facilitate the optimization of the threshold voltage of the select gate cells by writing thereinto. Likewise, setting the neutral threshold voltage of the select gate cells higher than the reference voltage allows for ease of optimization of the select gate cell threshold voltage.

Next, a description is given of a method to set precisely the target threshold voltage most suitable for the select gate cells by a combination of a write operation and a verify operation. First, a description is given of the case of the select gate cells M(18,1) and M(18,2) on the source line side.

In a write operation, all the bit lines BL1, BL2 and so on are set at 0V and the select gate cells M(18,1) and M(18,2) are written into. At write time, the select gate WL1 may be supplied with a voltage, say, 3V, which is high enough to allow the select gate cells M(1,1) and M(1,2) on the bit line side to turn on.

The target threshold voltage of the select gate cells M(18,1) and M(18,2) on the source line side are set such that their leakage current between the source and drain becomes so small as not to affect the memory cell write characteristic when the select gate WL18 is set at 0V and the source is at 3V and, at read time, the leakage current becomes so small as not to affect the read characteristic with WL18 set at 0V and the source at 0V.

That is, the target value of the threshold voltage of M(18,1) and M(18,2) is assumed to a tangential threshold voltage of 1V. The tangential threshold voltage refers to the threshold voltage at which a MOS transistor turns off which is obtained by tangential approximation of the relationship between the gate voltage and the logarithm of the drain current of the MOS transistor.

The writing for setting the threshold voltage of the select gate cells M(18,1) and M(18,2) is performed by controlling the threshold voltage while repeating the write and verify operations.

The writing is carried out using the step-up method which makes it easier to control the threshold voltage. With the width of a write pulse to the select gate WL18 set at 15 $\mu$s, the start value of the write voltage set at 14V, and the step size at 0.2V, the writing is performed until the target value is reached as the written state is verified at each step.

In this case, the verification is performed for each bit line. This is because, at this point, most of the select gate cells and memory cells are placed in the erase state and each block cannot therefore be cut off at the time of reading for verification. The bit lines for which the writing has terminated are supplied with the supply voltage 3V, whereby the writing is stopped.

Next, setting of the threshold voltage of the select gate cells M(1,1) and M(1,2) on the bit line side will be described. The writing into the select gate cells M(1,1) and M(1,2) differs from the writing into the select gate cells M(18,1) and M(18,2) in the following point.

That is, the select gate cells M(18,1) and M(18,2) require that the select gate WL18 be cut off at 0V when the memory cells are written into or read from.

On the other hand, the select gate cells M(1,1) and M(1,2) require that current flow from the channels of the memory cells to the bit lines BL1 and BL2 is cut off with the select gate WL1 and the bit lines supplied with the supply voltage 3V.

However, setting the threshold voltage of the select gate cells M(1,1) and M(1,2) too high will lower the channel initial voltage transferred from the bit lines via the select gate cells at the time of self-boost writing. With the initial voltage, the higher the better. A threshold voltage that allows the channel initial voltage to be high enough and the select gate cells M(1,1) and M(1,2) to be cut off at the time of writing into the memory cells is set as the target of their threshold voltage.

It is therefore desirable that the threshold of the select gate cells M(1,1) and M(1,2) on the bit line side be controlled more precisely than with the select gate cells M(18,1) and M(18,2) on the source side. Depending on the cell characteristics, the threshold voltage might be negative.

In the write and verify operations, as in the source-side select gate cell operation, the target value is set at, say, 0.5V as the tangential threshold voltage. The threshold voltage of the select gate cells M(1,1) and M(1,2) on the bit line side can be set using the step-up approach as with the source side by block-by-block writing and bit-by-bit verification unlike the source side.

In this case, non-selected blocks can be selected on a block-by-block basis because the source-side select gate cells can be cut off. As for columns, by applying the supply voltage 3V to bit lines connected to bit-line side select gate cells which have come to have the desired threshold voltage, writing can be stopped.

Thus, it is preferable to write into the bit line side select gate cells for which precise control of threshold voltage is desired on a block-by-block basis not on all-blocks-at-one-time basis.

After the select gate cells have been written into in the above-described manner, memory cells can be written into using the normal self-boost or LSB writing scheme with the source side select gate WL18 set at 0V, the source line set at 0V, the bit line to which 0 write memory cells are connected set at 0V, and the non-selected bit line set at 3V.

Figure 6:
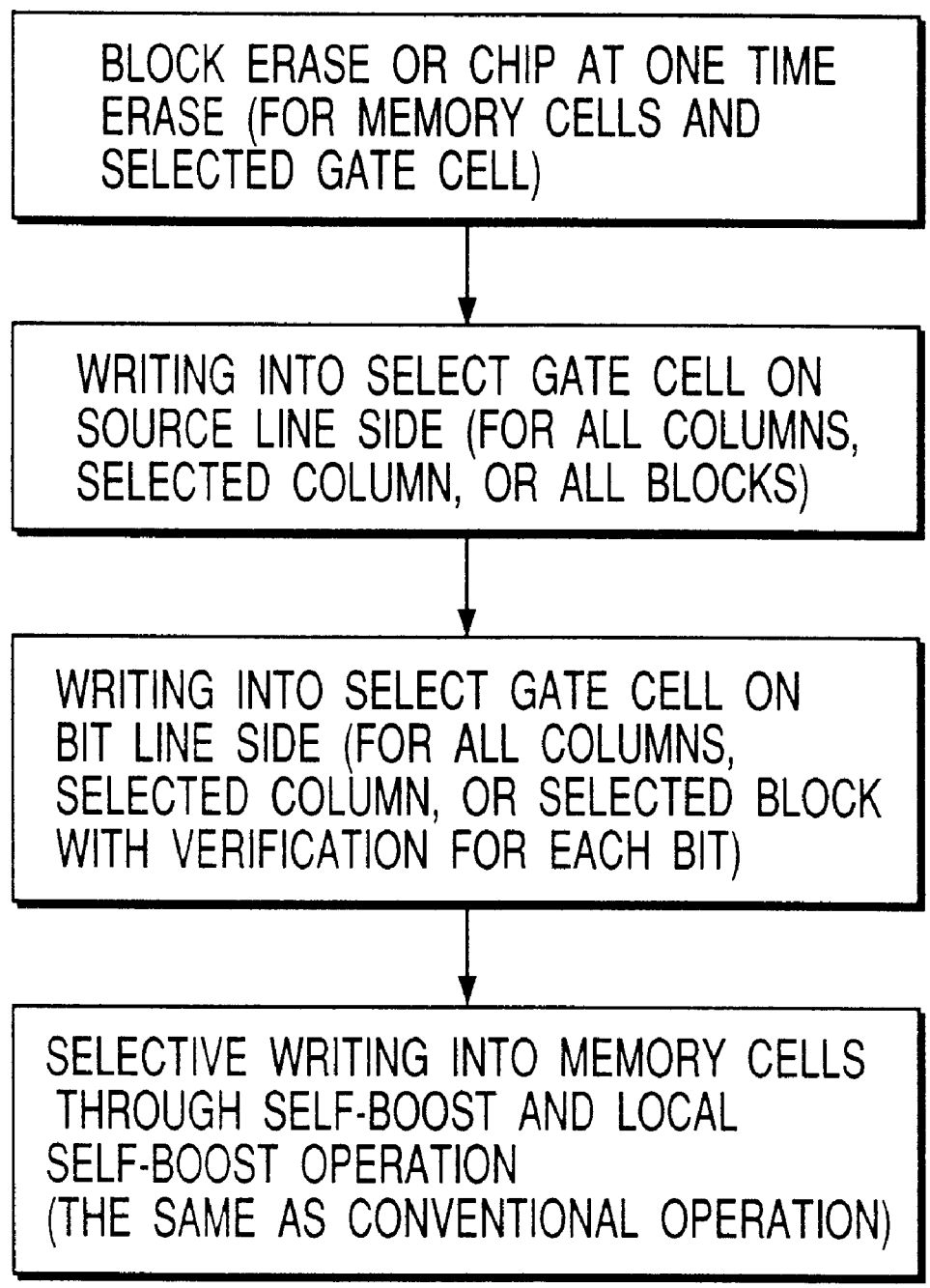
FIG. 6 shows a flow of the write operation of the EEPROM of the present invention.

FIG. 6 is a flow of the EEPROM write operation of the present invention described above. In the first place, all the memory cells including select gate cells are erased on a block-by-block basis or on all-blocks-at-one-time basis (chip erase) for initialization of the neutral threshold voltage of the cells.

Next, writing into the source side select gate cells is performed for all columns, selected columns, or all blocks. The written state is verified for each bit line. After that, the bit line side select gate cells are subjected to writing for all columns, selected columns, or selected blocks and verification is performed for each bit line to set the target value of threshold voltage. Thus, it becomes possible to write into and read from each of memory cells using the conventional self-boost or LSB scheme.

The above-described method allows the implementation of memory cells with very little erroneous writing. FIG. 7 shows a comparison in erroneous writing between the present invention and the prior art.

Figure 7A:
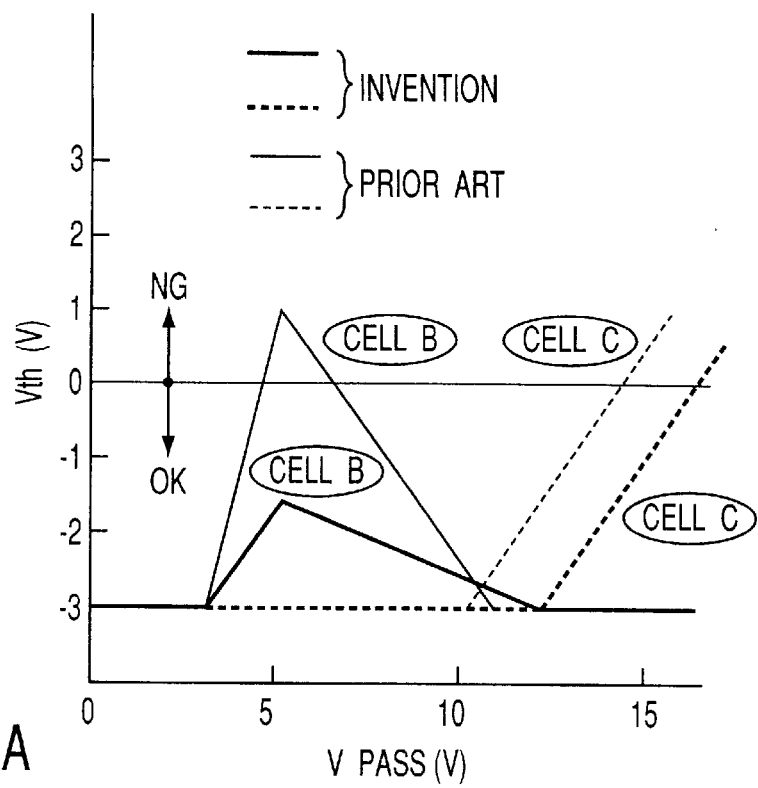
FIG. 7A shows threshold voltage versus transfer voltage for comparison of erroneous writing between the EEPROM of the invention and the prior art.
Figure 19:
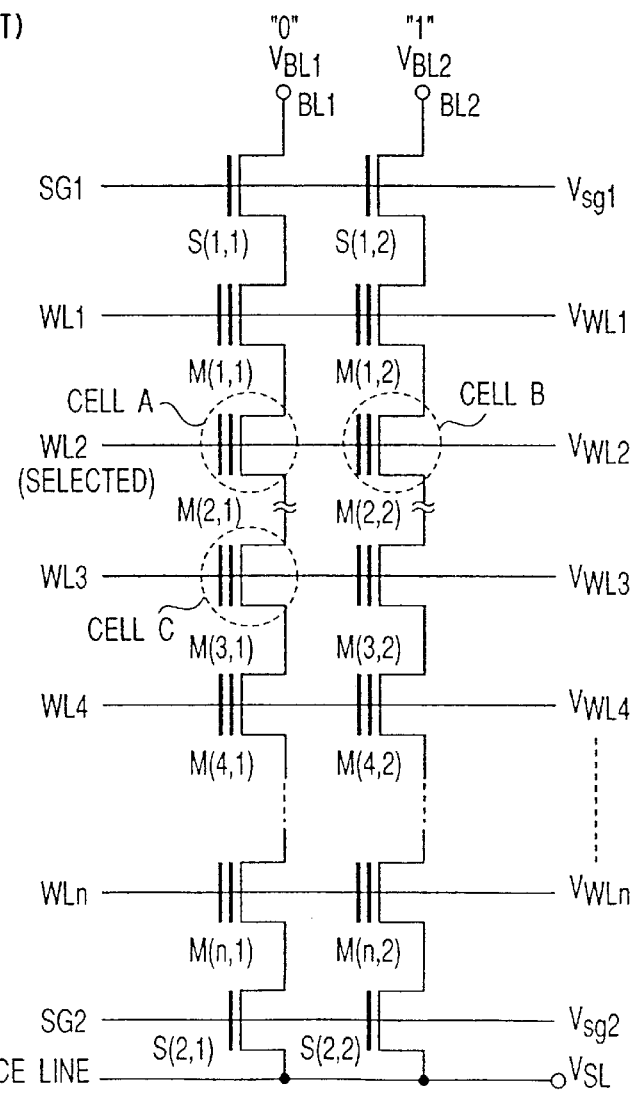
FIG. 19 shows applied voltages to an equivalent circuit of a prior art EEPROM in a self-boost write operation.
Figure 22:
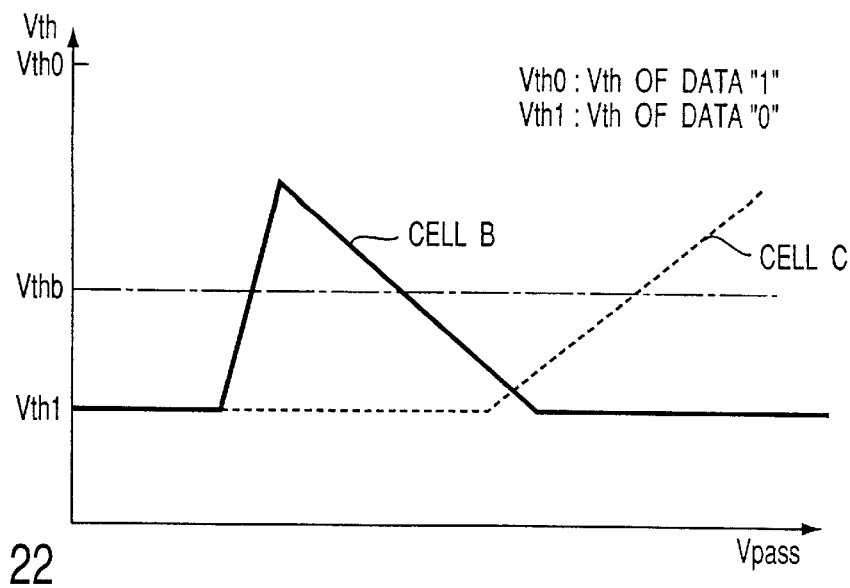
FIG. 22 is a diagram for use in explanation of erroneous writing in the prior art EEPROM.
Figure 23:
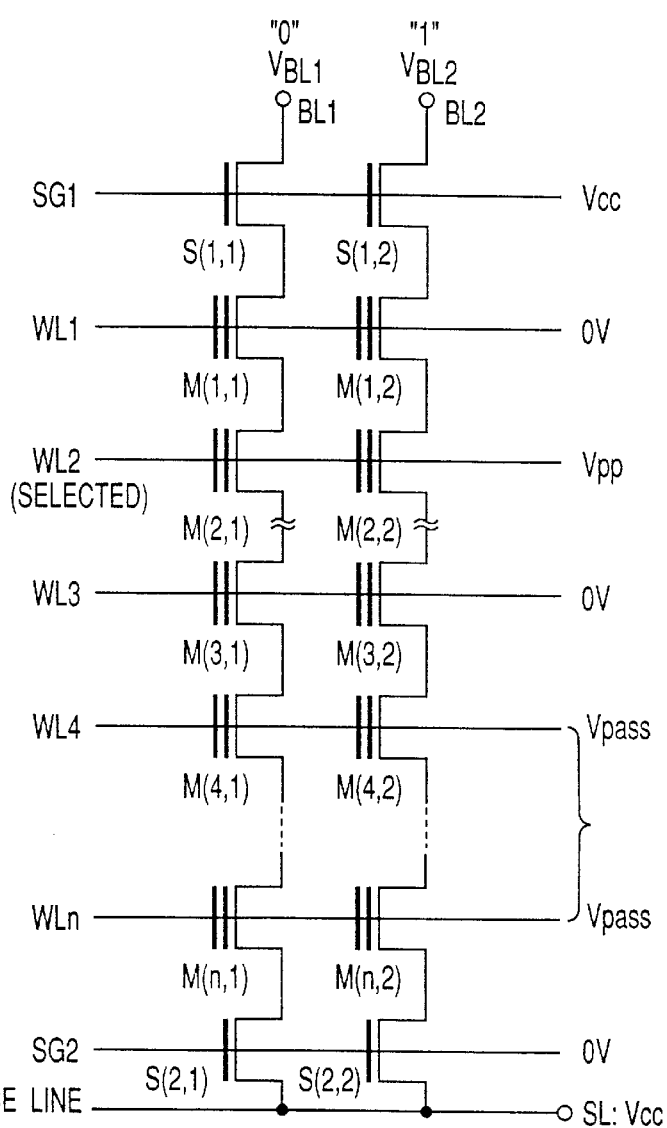
FIG. 23 is a diagram for use in explanation of the LSB operation of the prior art EEPROM.

FIG. 7A shows variations in the threshold voltages of the cell B connected to a non-selected bit line and the cell C connected to a non-selected word line as a function of transfer voltage (intermediate voltage) Vpass when a 0 is written into the cell A of FIG. 19 as described previously in connection with FIGS. 19 and 22. A fine solid line and a fine broken line indicate variations in the threshold voltage of the cells B and C, respectively, in the conventional EEPROM, while a bold solid line and a bold broken line indicate variations in the threshold voltage of the cells B and C, respectively, in the inventive EEPROM.

In FIG. 7A, the characteristic of some center bits is illustrated. In the conventional EEPROM, the threshold voltage (Vth) varies greatly with varying Vpass. In the presence of early written cells or when the cells show large variations in Vth after verification, erroneous writing occurs in many bits. In this case, trying to circumvent a failure in the cell B results in a large variation in Vth of the cell C, failing to allow for sufficient margin.

In the present invention, on the other hand, since the threshold voltage of the cell B does not greatly depend on Vpass, Vpass is allowed to be low and the Vth variation of both the cells B and C can be decreased. Further, in the invention, the impurity concentration in the channel of each memory cell can be adjusted by means of ion implantation without depending on the characteristic of the select gate cells. By adjusting the cell C write characteristic, therefore, it becomes possible to circumvent erroneous writing into the cell C and improve the margin even if Vpass is somewhat large.

Figure 7B:
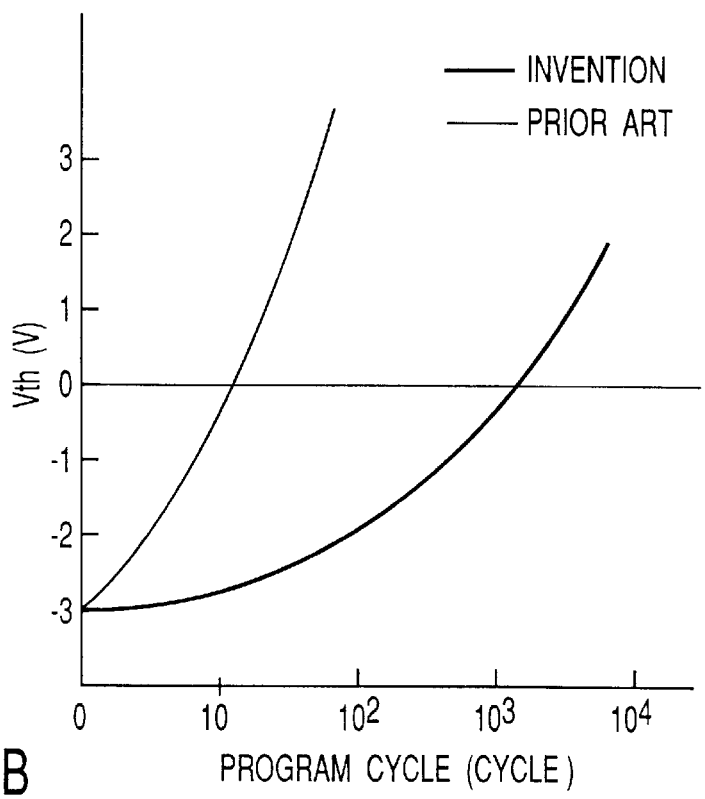
FIG. 7B shows threshold voltage versus program cycle for comparison of erroneous writing between the EEPROM of the invention and the prior art.

FIG. 7B shows an evaluation of the occurrences of erroneous writing into memory cells with respect to program cycles of an EEPROM as changes in threshold voltage of non-selected memory cells. The measurements for the prior art memory are shown by a fine solid line and the measurements for the inventive memory are illustrated by a bold solid line.

As shown in FIG. 7B, with the conventional EEPROM, erroneous writing occurs in about ten cycles. In the inventive EEPROM, on the other hand, no erroneous writing occurs up to about one thousand cycles.

Compared with the conventional EEPROM, the EEPROM of the present invention has the following superior features. That is, since cells of the same structure as memory cells are used as select gate cells in writing into the memory cells, the spacing between adjacent ones of the word lines WL1 to WL18 including the select gates becomes uniform, displaying high dimensional controllability in fine pattern lithography with no influence of the proximity effect.

With the structure of the EEPROM in the first embodiment, the charge storage layers of the memory cells including select gate cells are formed to self-align to the device isolation trenches and separated in the row direction above each of the device isolation trenches with the spacing corresponding to the uniform width of the trenches. Therefore, the device isolation region pattern can be made a repeating pattern of a simple line, improving processing controllability for the device isolation region.

Moreover, pre-writing into the memory cells connected to the select gates at one time allows these cells to have a desired threshold voltage for use as select gate cells. This allows the gate oxide thickness and the channel impurity profile to be controlled at the same time in the same process for all the memory cells including the select gate cells.

In other words, the impurity concentration of the channels is lowered to improve the memory cell boost ratio for the purpose of reducing erroneous writing into memory cells and the lowered neutral threshold voltage of the select gate cells due to the lowered channel impurity concentration is compensated for by writing into the select gate cells, thereby increasing significantly the threshold voltage of the select gate cells up to a value that allows them to exhibit a sufficient cutoff characteristic.

In the EEPROM of the present invention, by increasing the threshold voltage of M(1,1), M(1,2), M(18,1), M(18,2), and so on through pre-writing, their cutoff characteristic is improved. However, if the memory cell gate length is reduced to the order of deep submicrometers as the pattern size decreases, then the punch-through withstand voltage will be reduced, degrading the cutoff characteristic.

To solve this problem, the gate length (the width of the charge storage layer in the direction of bit line length) of the select gate cells M(1,1), M(1,2), M(18,1), M(18,2) and so on is simply increased as required in comparison with that of the other memory cells although there is some reduction in integration density.

Next, a fourth embodiment of the present invention will be described with reference to FIG. 8. As shown in an equivalent circuit of FIG. 8, the fourth embodiment is characterized in that all the memory cells M(i, j) (i=1 to 18, j=1 to 3) including select gate cells M(1, j) and M(18, j) between source line and bit line contacts have a two-layered gate structure of a control gate layer and a charge storage layer, and transfer transistors Tij are each placed in parallel with a corresponding one of the memory cells M(i, j).

BL1 to BL3 denote bit lines, WL1 and WL18 denote select gates connected to the select gate cells, WL2 to WL17 denote word lines connected to the memory cells. The whole memory cell array is formed by arranging such a memory cell pattern up and down as if the pattern were folded back up and down along a line of bit line contacts and a line of source line contacts.

In the read operation of the EEPROM shown in FIG. 4B, since non-selected memory cells and select gate cells are required to be normally on, the select gates WL1 and WL18 and the word lines connected to the non-selected memory cells must be supplied with a low positive voltage of the order of 3V. As described previously, the low positive voltage must be set higher than the highest threshold voltage of memory cells in the 0 written state.

In this case, however, an excessive effective electric field based on the low positive voltage is applied to the first gate insulating film (tunnel insulating film) of the non-selected memory cells in the erase state; thus, such memory cells might be written in error. If the memory cells show large variations in threshold voltage, then the non-selected memory cells are placed in the off state, in which case no current flows to the bit lines and erroneous reading occurs.

Although the threshold voltage of the select gate cells has been set to a desired one through pre-writing, in the event that erroneous writing into the select gate cells occurs during operation to thereby increase their threshold voltage, variations in read current and erroneous reading will occur.

Figure 8:
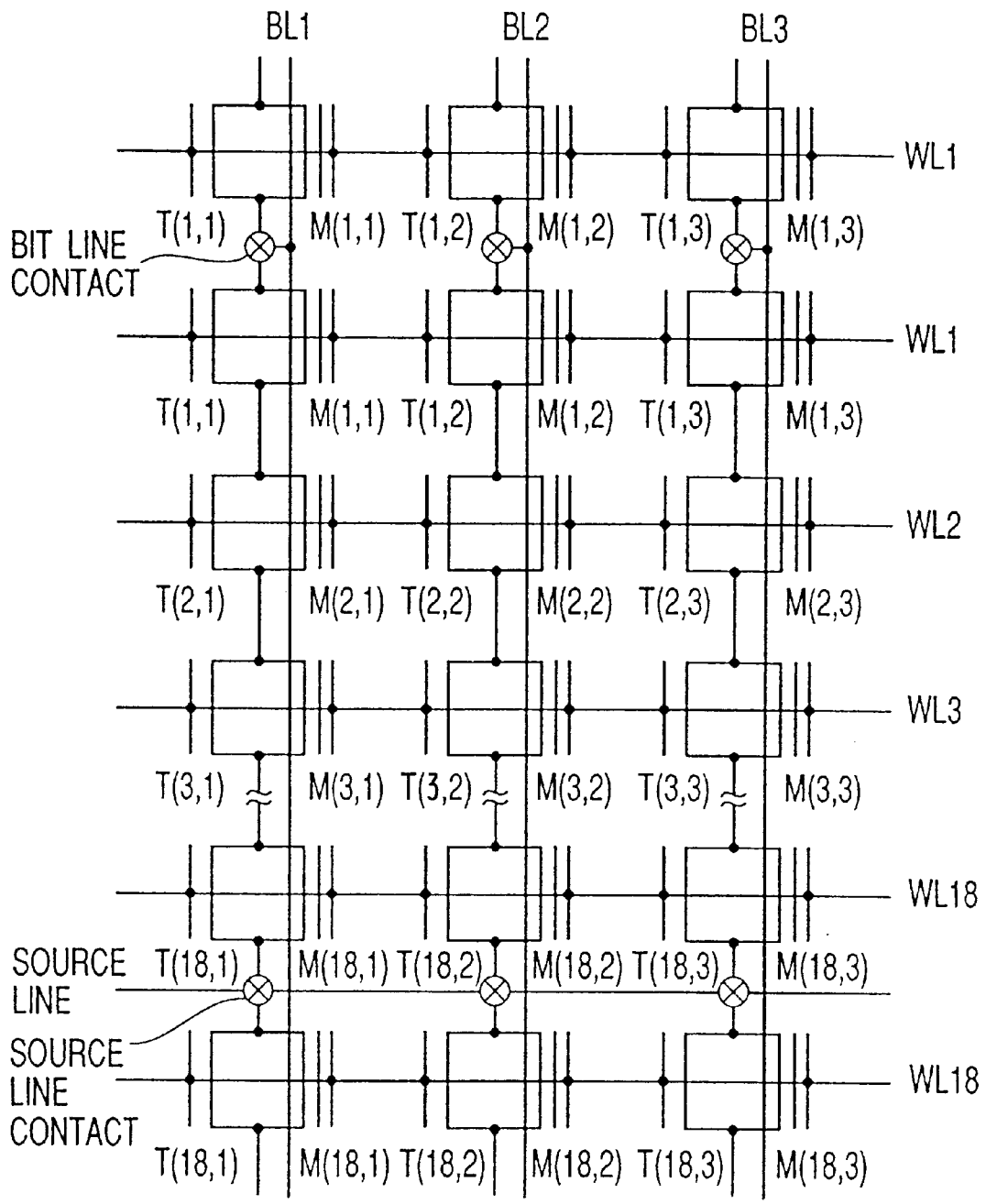
FIG. 8 shows an equivalent circuit of an EEPROM according to a fourth embodiment of the present invention.

In the fourth embodiment, as shown in FIG. 8, each transfer transistor Tij is placed in parallel with the corresponding memory cell M(i, j) in such a way that they share diffused layers. The threshold voltage of the transfer transistors is set at a value substantially equal to the threshold voltage previously written (set) in one of the select gate cells M(1, j) and M(18, j).

This configuration prevents erroneous writing even if the threshold voltage of the select gate cells is changed to a higher value than the set value through writing because the transfer transistors will transfer voltage even in such a case.

The read operation of the EEPROM of the fourth embodiment will be described with reference to FIG. 9. In reading from the memory cell M(3,1), an intermediate voltage of, say, 0V between a negative threshold voltage in the erase state and a positive threshold voltage in the 0 written state is applied to the word line WL3 to which the memory cell M(3,1) and the transfer transistor T3,1 are connected.

At this point, a positive voltage of, say, 2V is applied to the word lines associated with non-selected memory cells and the select gate cells WL1 and WL18. This voltage value is required to be higher than the threshold voltage of the transfer transistors.

Reading from the selected memory cell is performed by monitoring its channel current with an appropriate voltage of, say, 1V applied to the bit line BL1. Even if the intervening non-selected memory cell M(1,1) is in the 0 written state and consequently its threshold voltage becomes higher than the positive voltage applied to its control gate layer (WL2), 2V, the bit line voltage, 1V, is transferred to the selected memory cell M(3,1) because the parallel-connected transfer transistor T(2,1) is in the on state. Thus, no erroneous writing will occur.

Therefore, the positive voltage (say, 2V) applied to the word lines associated with non-selected memory cells and the select gates WL1 and WL18 can be made lower than the positive voltage (say, 3V) applied in the read operation shown in FIG. 4B. For this reason, the effective electric field applied across the first gate insulating film of the non-selected memory cells can be reduced, allowing a significant reduction in incorrect writing.

Moreover, even in the event that the threshold voltage of the select gate cells M(1,1) and M(18,1) goes higher during operation, variations in read current can effectively be controlled because the parallel-connected transfer transistors T1,1 and T18,1 are in the on state. The higher the current drivability of the transfer transistors T(1,1) and T(18,1), the more the effectiveness increases. Writing and erasing can be performed in the same manner as with the second embodiment shown in FIGS. 3 and 4A.

Figure 9:
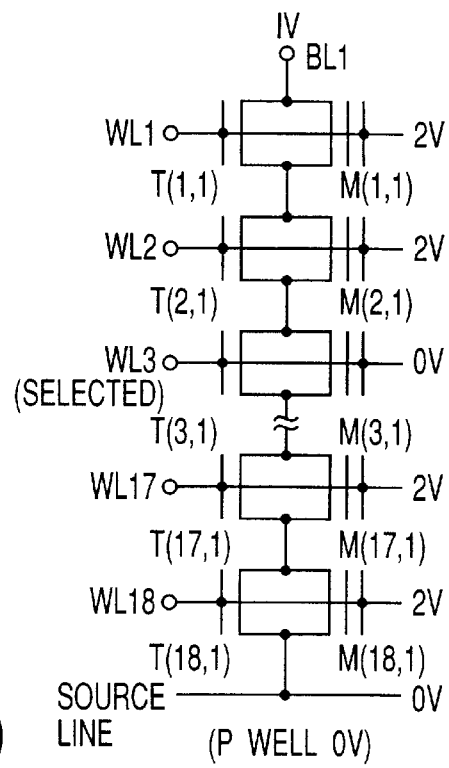
FIG. 9 hows applied voltages to the equivalent circuit of FIG. 8 in a read operation.

The structure of an EEPROM according to a fifth embodiment of the present invention will be described with reference to FIG. 10, which is a sectional view of the EEPROM whose equivalent circuit is shown in FIG. 9.

Figure 10:
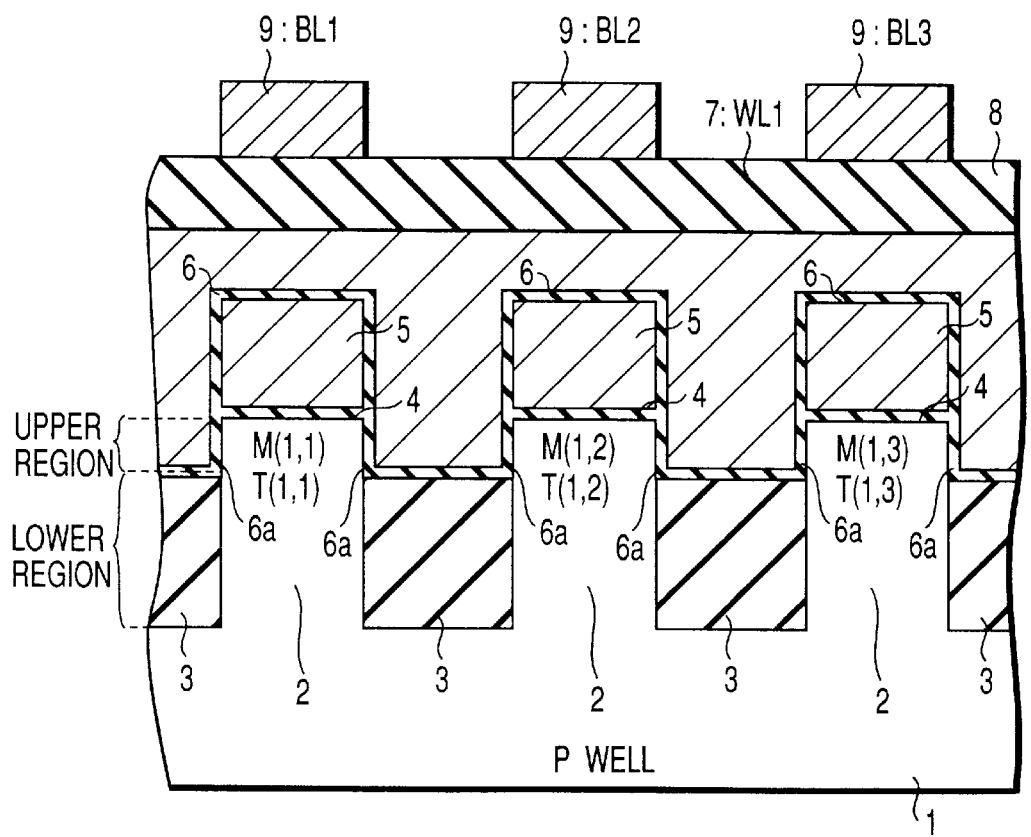
FIG. 10 is a view similar to that of FIG. 2 and illustrates an EEPROM according to the fifth embodiment of the present invention.

The sectional structure of the EEPROM shown in FIG. 10 is close to that of the first embodiment described in connection with FIG. 2. Therefore, like reference numerals are used to denote corresponding parts in FIG. 2 and the detailed description thereof is omitted.

In both the EEPROMS, the charge storage layer 5 is formed to self-align to the device isolation region 3 where the trench is filled with the insulating material and the lower portion of the device region 2 is opposite to the insulating material that fills the trench. In the fifth embodiment, the upper portion of the device region 2 is also opposite to the control gate layer 7 with a third gate insulating film 6a which is an extension of the second gate insulating film 6 interposed therebetween.

The third gate insulating film 6a, while being formed thicker than at least the first gate insulating film 4, may be substantially equal to the second gate insulating film 6 or set at any other optimum value in thickness. In this way, the memory cell having the charge storage layer 5 and the control gate layer 7 formed above the device region 2 is formed. At the same time, the MOS structure is formed in the upper portion of the device region so as to be opposite to the control gate layer 7 with the upper portion of the device region as the common channel region to the memory cell and the MOS structure.

The MOS structure has, in common with the memory cell, source/drain diffused layers formed in those regions in the device region 2 which are opposite to each other in the direction perpendicular to the drawings. Thus, the MOS structure becomes connected in parallel with the memory cell as shown in the equivalent circuit of FIG. 9.

In order for the threshold voltage of the MOS structure thus formed to become substantially equal to the threshold voltage of the select gate cells M(1, j) and M(18, j) set through pre-writing, the impurity profile of the device region 2 or the thickness of the third gate insulating film 6a should be adjusted properly. Although the coupling ratio of the memory cells can be adjusted by changing the height of the upper portion of the device region shown in FIG. 10, the height is usually set to be the same for all the memory cells.

The memory cell array of FIG. 10 is favorable for fine pattern formation because the formation of the transfer transistor involves no increase in cell area. Such a memory cell array thus allows for high-performance and high-reliability EEPROMs.

The EEPROM of the fifth embodiment has all the structural advantages with respect to fine pattern formation that the first embodiment has. Making the gate length of the select gate cells M(1, j) and M(18, j) and their associated transfer transistors T1j and T18j larger than that of the memory cells allows the drain breakdown voltage of the select gate cells to be increased.

Next, a problem of which of the maker side and the user side the threshold control of the select gate cells through charge injection most suitable for the prevention of erroneous writing should be performed on in the EEPROM of the present invention will be discussed.

There are two ways of thinking: one is that the threshold control should be performed on the maker side at the time of shipment of EEPROMS, and the other is that the maker ships as-manufactured EEPROMs and the user performs one-time erasing of all of the gate select cells and the memory cells, then writing into the select gate cells and selective writing into the memory cells before use.

In the latter case, if memory write control equipment used on the user side is configured to perform such a sequence of operations, then stress due to erasing of and writing into the select gate cells will be imposed every time data are rewritten by the user. For this reason, the operational lifetime of the select gate cells may be reduced, depending on program cycles for data rewrite.

If, on the user side, one-time erasing of the select gate cells and the memory cells and writing into the select gate cells are performed every time data are rewritten, then the total write time will be increased.

For these reasons, it is expected to be the best way to perform the select gate cell threshold control on the maker side at the time of shipment of EEPROMs and not to erase charges stored in the select gate cells at the time of data rewriting on the user side. At this point, replenishment of the charges stored in the select gate cells allows a reduction in the operational lifetime of the select gate cells due to program cycles being small.

In the first through sixth embodiments, EEPROMs have been described in which, like memory cells, select gate cells each have a charge storage layer; however, the present invention is not limited to the embodiments.

The present invention is applicable to EEPROMS in general in which memory cells are arranged in an array and switching transistor-based select gate cells are used to make a selection among memory cell groups. Although the embodiments have been described as using N-channel MOS transistor type memory cells, this is merely exemplary; P-channel MOS transistor type memory cells can also be used to form an EEPROM. It is apparent that the present invention may be practiced or embodied in still other ways without departing from the scope and spirit thereof.

According to the EEPROM of the present invention, as described above, through the use of select gate cells in which their threshold voltage can be controlled through charge storage, the cutoff characteristic of those cells in reading from and writing into memory cells can be controlled freely by writing into the select gate cells.

Thus, the implant dose for the memory cell channels can be reduced compared with the prior art, allowing the channel boost ratio to be increased in self-boost and LSB write operations and erroneous writing into the memory cells to be reduced significantly.

In addition, the threshold voltage of the select gate cells on the bit line side can be set low, which enables their transfer capability to be enhanced and the channel initial voltage to be increased. This helps reduce erroneous writing.

Moreover, the select gate cells and the memory cells can be subjected to ion implantation into their respective channels at the same time in the same process, allowing for ease in advanced fine pattern formation. Furthermore, the channel implant dose can be set taking into consideration only the memory cell characteristics. This prevents the write voltage from becoming lowered carelessly; otherwise, the erroneous writing characteristic and the read disturb characteristic will be degraded.

The severity of the problem of erroneous writing increases in the order of two-valued memory, four-valued memory and eight-valued memory. The cell structure of the present invention can be used to implement highly reliable multi-valued memories, particularly four or more valued memories. With EEPROMS becoming fine patterned and multi-valued, the present invention can further display its effectiveness to implement high-integration EEPROMs with little erroneous writing.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A non-volatile semiconductor memory device comprising:

a memory cell array including NAND cells, each of the NAND cells having a plurality of memory cells and at least one of a first select gate cell and a second select gate cell, the plurality of memory cells being connected in series to form a NAND string, the first select gate cell being connected between a bit line and the memory cell nearest to the bit line, the second select gate cell being connected between a source line and the memory cell nearest to the source line, and each of the memory cells having a charge storage layer and a control gate layer, wherein each of the first select gate cell and the second select gate cell has a control gate layer and a charge storage layer each of which is of substantially the same dimension as that of the memory cells, and writing data into the first and second select gate cells is performed prior to writing data into the memory cells.

2. A non-volatile semiconductor memory device comprising:

a memory cell array including NAND cells, each of the NAND cells having a plurality of memory cells and at least one of a first select gate cell and a second select gate cell, the plurality of memory cells being connected in series to form a NAND string, the first select gate cell being connected between a bit line and the memory cell nearest to the bit line, the second select gate cell being connected between a source line and the memory cell nearest to the source line, and each of the memory cells having a charge storage layer and a control gate layer, wherein each of the first select gate cell and the second select gate cell has a control gate layer and a charge storage layer each of which is of substantially the same dimension as that of the memory cells, and writing data into the second select gate cell is performed prior to writing data into the first select gate cell.

3. A non-volatile semiconductor memory device comprising:
- a memory cell array including NAND cells, each of the NAND cells having a plurality of memory cells and at least one of a first select gate cell and a second select gate cell, the plurality of memory cells being connected in series to form a NAND string, the first select gate cell being connected between a line and the memory cell nearest to the bit line, the second select gate cell being connected between a source line and the memory cell nearest to the source line, and each of the memory cells having a charge storage layer and a control gate layer, wherein
- each of the first select gate cell and the second select gate cell has a control gate layer and a charge storage layer each of which is of substantially the same dimension as that of the memory cells, and
- a threshold voltage of the first select gate cell after writing data therein is lower than a threshold voltage of the second select gate cell after writing therein.

4. A non-volatile semiconductor memory device comprising:
- a memory cell array including NAND cells, each of the NAND cells having a plurality of memory cells and at least one of a first select gate cell and a second select gate cell, the plurality of memory cells being connected in series to form a NAND string, the first select gate cell being connected between a bit line and the memory cell nearest to the bit line, the second select gate cell being connected between a source line and the memory cell nearest to the source line, and each of the memory cells having a charge storage layer and a control gate layer, wherein
- each of the first select gate cell and the second select gate cell has a control gate layer and a charge storage layer each of which is of substantially the same dimension as that of the memory cells, and
- a plurality of the NAND cells constitutes a memory block, and writing data into the second select gate cells in at least the same column is performed at one time for all memory blocks each comprised of a plurality of the NAND cells.

5. A non-volatile semiconductor memory device comprising:
- a memory cell array including NAND cells, each of the NAND cells having a plurality of memory cells and at least one of a first select gate cell and a second select gate cell, the plurality of memory cells being connected in series to form a NAND string, the first select gate cell being connected between a bit line and the memory cell nearest to the bit line, the second select gate cell being connected between a source line and the memory cell nearest to the source line, and each of the memory cells having a charge storage layer and a control gate layer, wherein
- each of the first select gate cell and the second select gate cell has a control gate layer and a charge storage layer each of which is of substantially the same dimension as that of the memory cells, and
- writing data into the first and second select gate cells is performed using a write voltage that changes in a step-like manner from an initial voltage, and the written state is read at each step for write verification.

6. A non-volatile semiconductor memory device comprising:
- a memory cell array including NAND cells, each of the NAND cells having a plurality of memory cells and at least one of a first select gate cell and a second select gate cell, the plurality of memory cells being connected in series to form a NAND string, the first select gate cell being connected between a bit line and the memory cell nearest to the bit line, the second select gate cell being connected between a source line and the memory cell nearest to the source line, and each of the memory cells having a charge storage layer and a control gate layer, wherein
- each of the first select gate cell and the second select gate cell have a control gate layer and a charge storage layer, and
- in a data write mode for writing data into the memory cell array, a memory cell located on the bit line side of a non-selected memory cell to be not written which memory cell is connected to the same word line as a selected memory cell to be written or the first select gate cell and a memory cell located on the source line side of the non-selected memory cell or the second select gate cell are turned off.

7. A non-volatile semiconductor memory device comprising:
- a memory cell array including NAND cells, each of the NAND memory cells having a plurality of memory cells and at least one of a first select gate cell and a second select gate cell, the plurality of memory cells being connected in series to form a NAND string, the first select gate cell being connected between a bit line and the memory cell nearest to the bit line, the second select gate cell being connected between a source line and the memory cell nearest to the source line, and each of the memory cells having a charge storage layer and a control gate layer, wherein
- each of the first select gate cell and the second select gate cell has a control gate layer and a charge storage layer,
- the memory cells and the first and second select gate cells are formed in each of a plurality of device regions defined by device isolation regions formed by filling isolation trenches extending along a direction of a semiconductor substrate with an insulating material,
- the charge storage layer of each of the memory cells and the first and second select gate cells is formed above the device region to self-align to the device region with a first gate insulating film interposed therebetween,
- the control gate layer of each of the memory cells and the first and second select gate cells is formed above the charge storage layer with a second gate insulating film interposed therebetween, the second gate insulating film covering a top and part of the sidewall of the charge storage layer, the charge storage layer is self-aligned to the isolation trenches, and has a lower portion contiguous to the device isolation region and an upper portion that is opposite to the control gate layer with the second gate insulating film interposed therebetween, and a height of the lower portion of the charge storage layer is substantially the same for the memory cells and the first and second select gate cells.

8. A non-volatile semiconductor memory device comprising:
- a memory cell array including NAND memory cells, each of the NAND memory cells having a plurality of memory cells and at least one of a first select gate cell and a second select gate cell, the plurality of memory cells being connected in series to form a NAND string, the first select gate cell being connected between a bit line and the memory cell nearest to the bit line, the second select gate cell being connected between a source line and the memory cell nearest to the source line, and each of the memory cells having a charge storage layer and a control gate layer, wherein each of the first select gate cell and the second select gate cell has a control gate layer and a charge storage layer, a plurality of transfer transistors are provided, each of which is connected in parallel with a corresponding respective one of the memory cells and the first and second select gate cells, and a threshold voltage of the transfer transistors is substantially equal to that of at least one of the first and second select gate cells.

9. The non-volatile memory device according to claim 8, wherein the memory cells and the first and second select gate cells are formed in each of a plurality of device regions defined by device isolation regions formed by filling isolation trenches extending along a direction of a semiconductor substrate with an insulating material, the charge storage layer of each of the memory cells and the first and second select gate cells is formed above the device region to self-align to the device region with a first gate insulating film interposed therebetween, the control gate layer of each of the memory cells and the first and second select gate cells is formed above the charge storage layer and the device region with a second and a third gate insulating film interposed therebetween, the second gate insulating film covering a top and sidewall of the charge storage layer and the third gate insulating film covering the upper portion of the device region, the third gate insulating film being thicker than the first insulating film, the charge storage layer is self-aligned to the isolation trenches, and the transfer transistor has a MOS structure formed by the control gate layer and the upper portion of the device region opposite to each other with the third gate insulating film interposed therebetween.

10. The non-volatile semiconductor memory device according to claim 6, wherein the control gate layer and the charge storage layer of each of the first and second select gate cells is of substantially the same dimension as that of the memory cells.

11. The non-volatile semiconductor memory device according to claim 7, wherein the control gate layer and the charge storage layer of each of the first and second select gate cells is of substantially the same dimension as that of the memory cells.

12. The non-volatile semiconductor memory device according to claim 8, wherein the control gate layer and the charge storage layer of each of the first and second select gate cells is of substantially the same dimension as that of the memory cells.

* * * * *